United States Patent
Kaeriyama

(10) Patent No.: US 10,333,509 B2
(45) Date of Patent: Jun. 25, 2019

(54) DRIVE DEVICE AND POWER SUPPLY SYSTEM

(71) Applicant: RENESAS ELECTRONICS CORPORATION, Tokyo (JP)

(72) Inventor: Shunichi Kaeriyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 53 days.

(21) Appl. No.: 15/627,363

(22) Filed: Jun. 19, 2017

(65) Prior Publication Data

US 2017/0373676 A1   Dec. 28, 2017

(30) Foreign Application Priority Data

Jun. 22, 2016  (JP) ................................ 2016-123434

(51) Int. Cl.
*H03K 17/04* (2006.01)
*H03K 17/14* (2006.01)
*H03K 17/16* (2006.01)

(52) U.S. Cl.
CPC ......... *H03K 17/0406* (2013.01); *H03K 17/14* (2013.01); *H03K 17/167* (2013.01)

(58) Field of Classification Search
CPC ... H03K 17/0406; H03K 17/14; H03K 17/167
USPC .... 327/108–112, 427, 434, 437; 326/82, 83, 326/87
See application file for complete search history.

(56) References Cited

U.S. PATENT DOCUMENTS

2001/0040470 A1* 11/2001 Brando ............ H03K 17/04206
327/109

FOREIGN PATENT DOCUMENTS

DE      10 2004 055 358 B3    12/2005
DE      102004055358 B3 *     12/2005  .......... H02M 7/5387

OTHER PUBLICATIONS

Y. Lobsiger, J.W. Kolar, "Closed-loop IGBT gate drive featuring highly dynamic di/dt and dv/dt control," 2012 IEEE Energy Conversion Congress and Exposition (ECCE).
Extended European Search Report issued in corresponding European Patent Application No. 17177167.8, dated Oct. 25, 2017.

* cited by examiner

Primary Examiner — Tomi Skibinski
(74) Attorney, Agent, or Firm — McDermott Will & Emery LLP

(57) ABSTRACT

The present invention provides a drive device and a power supply system capable of driving a power transistor with low power while reflecting variations in manufacture process and external environments. A trigger detection circuit monitors a voltage between terminals or a current between terminals in a switching period of a power transistor and detects that the voltage between terminals or the current between terminals reaches a predetermined reference value. A current switching circuit selects a register outputting a current value to a variable current driver circuit from a plurality of registers and switches the register to be selected using a detection result of the trigger detection circuit as a trigger in the switching period, thereby making the drive current of the variable current driver circuit shift.

19 Claims, 22 Drawing Sheets

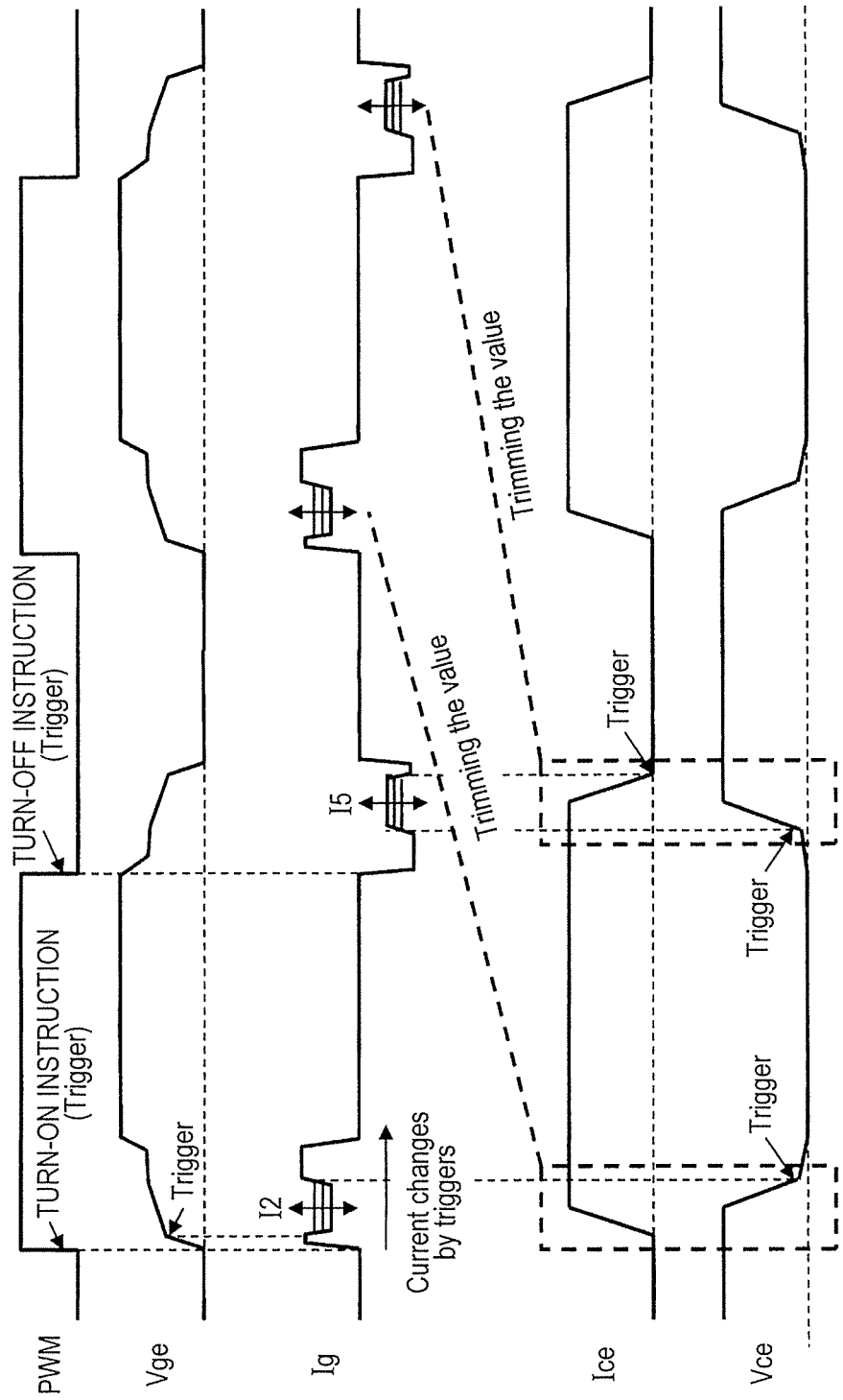

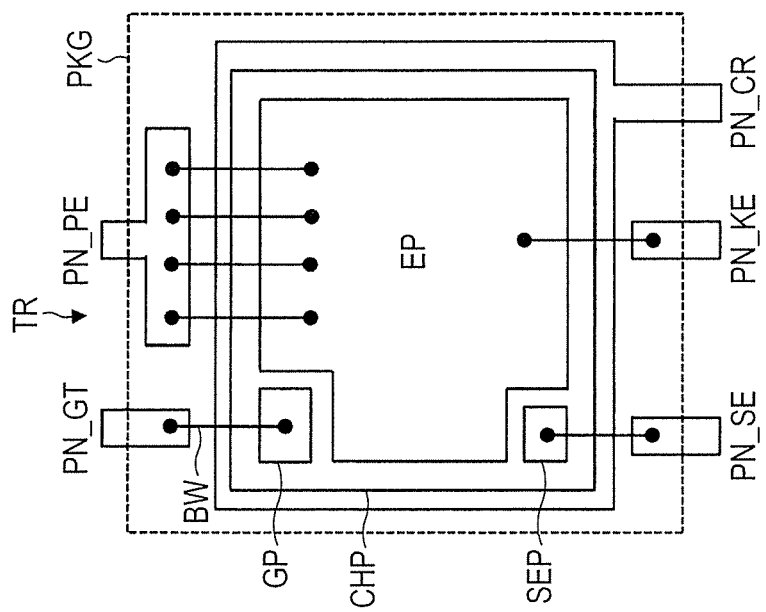
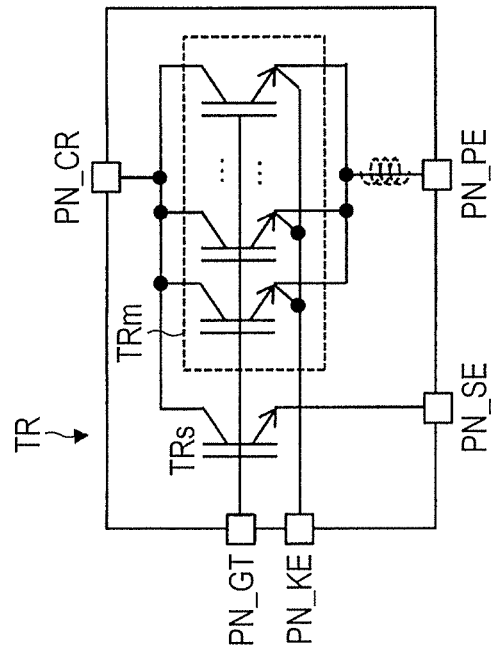
FIG. 9B
FIG. 9A

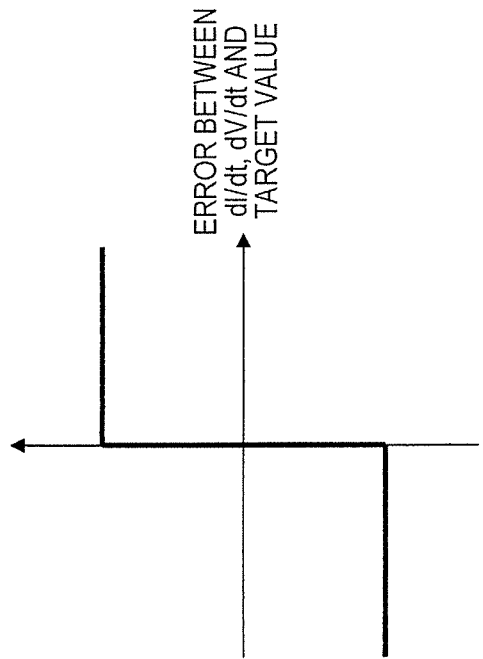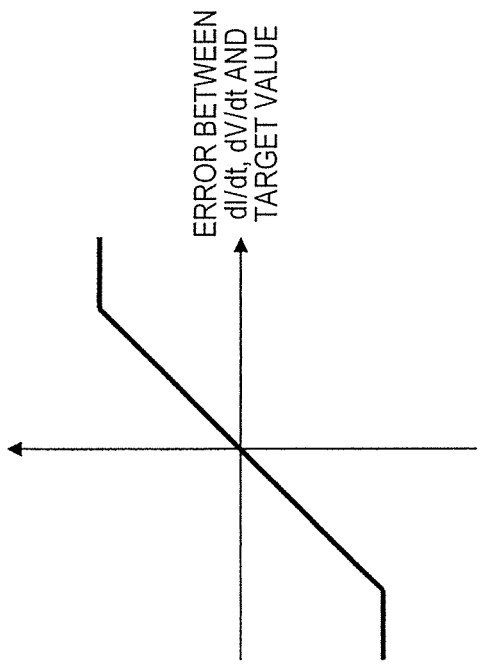

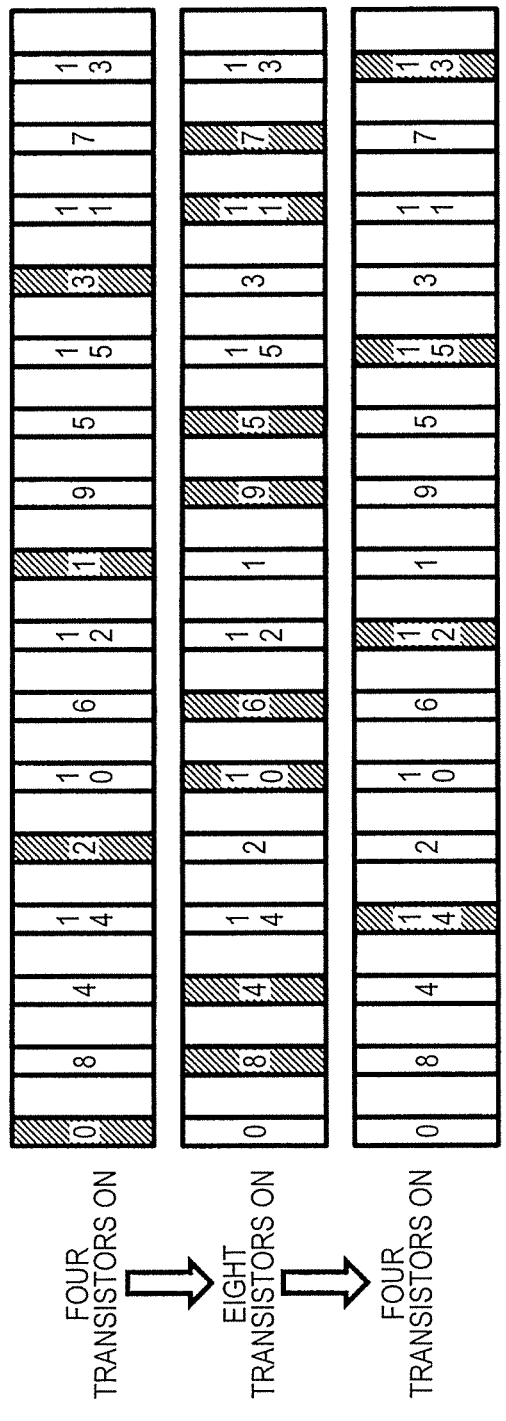

| GATE RESISTANCE/ SWITCHING SPEED | RESISTANCE: LARGE/ LOW-SPEED SWITCHING | RESISTANCE: SMALL/ HIGH-SPEED SWITCHING |
|---|---|---|
| OVERSHOOT OF Ice AND Vce | SMALL (GOOD) | LARGE (BAD: DANGER OF DESTRUCTION) |
| SWITCHING LOSS | LARGE (BAD: EFFICIENCY DECREASE) | SMALL (GOOD) |
| RADIATION NOISE | SMALL (GOOD) | LARGE (BAD: STANDARD NON-CONFORMITY) |

FEEDFORWARD (OPEN LOOP) TYPE

FEEDBACK TYPE

DRIVE DEVICE AND POWER SUPPLY SYSTEM

CROSS-REFERENCE TO RELATED APPLICATIONS

The disclosure of Japanese Patent Application No. 2016-123434 filed on Jun. 22, 2016 including the specification, drawings and abstract is incorporated herein by reference in its entirety.

BACKGROUND

The present invention relates to a drive device and a power supply system and relates to, for example, a technique of controlling on/off of a power transistor in a system such as an inverter and a switching power supply.

For example, in non-patent literature 1, as the configuration of an active gate driver, the configuration of an open loop type and the configuration of an analog feedback type are described. In the former configuration, the charge/discharge period of a gate is preliminarily divided to a plurality of intervals, and the gate is driven in a state where the length of each of the intervals and charge/discharge current in each of the intervals are fixedly determined. In the latter configuration, an error between an observation result of di/dt or dv/dt and a target value is reflected in an analog amplifier at high speed, and the gate is driven by the analog amplifier.

RELATED ART LITERATURE

Patent Literature

Non-Patent Literature 1: Y. Lobsiger, J. W. Kolar, "Closed-loop IGBT gate driver featuring highly dynamic di/dt and dv/dt control", 2012 IEEE Energy Conversion Congress and Exposition (ECCE)

SUMMARY

For example, at the time of driving a power transistor such as an MOSFET (Metal Oxide Semiconductor Field Effect Transistor) or an IGBT (Insulated Gate Bipolar Transistor), it is necessary to consider switching speed of the power transistor. Concretely, when the switching speed is increased, the switching loss can be reduced. Instead, accompanying overshoot or undershoot of a voltage waveform and a current waveform, increase in noise, excess of the withstand voltage of the power transistor, and the like may occur. On the contrary, when the switching speed is decreased, reduction of noise and the like can be realized. Instead, increase in the switching loss and the like may occur. Therefore, it is requested to properly control the switching speed in consideration of the tradeoff relation.

As the switching speed control method, generally, a method of adjusting the resistance value of a gate resistor is known. The method is, however, a method of finding a compromising point of the above-described tradeoff relation and is not a method of taking advantages in each of the case where the switching speed is fast and the case where the switching speed is slow. Therefore, a method of using an active gate driver as described in the non-patent literature 1 is useful. However, in the above-mentioned open-loop-type configuration, when variations of manufacture process and external environment (so-called PVT (Process Voltage and Temperature) variations) occur, in some cases, desired performances cannot be obtained. On the other hand, in the configuration of the analog feedback type, for example, increase of power consumption by a high-speed analog amplifier and the like is concerned.

Embodiments to be mentioned later are made in consideration of the above and other problems and novel features will become apparent from the description of the present specification and appended drawings.

A drive device according to an embodiment has a plurality of registers, a variable current driver circuit, a first detection circuit, and a current switching circuit. Each of the plurality of registers holds a current value as a digital value. To the variable current driver circuit, the digital value of any of the plurality of registers is input. The variable current driver circuit drives the power transistor by drive current based on the digital value. The first detection circuit monitors a voltage between terminals or a current between terminals of the power transistor in a switching period of the power transistor and detects that the voltage between terminals or the current between terminals reaches a predetermined reference value. The current switching circuit selects a register outputting a current value to the variable current driver circuit from the plurality of registers and switches the register to be selected using a detection result of the first detection circuit as a trigger in the switching period, thereby making the drive current of the variable current driver circuit shift.

According to the embodiment, the power transistor can be driven by low power while reflecting variations of manufacture process and external environment.

BRIEF DESCRIPTION OF THE DRAWINGS

FIG. 4 is a diagram illustrating an example of schematic drive waveforms of a power transistor by the drive device of FIG. 3.

FIGS. 9A and 9B are schematic diagrams illustrating a configuration example of the power transistor in FIG. 8.

FIG. 11A is a conceptual diagram expressing an operation method by the current value adjustment circuit of FIG. 10A, and FIG. 11B is a conceptual diagram expressing an operation method as a comparison example of FIG. 11A.

FIG. 18 is a conceptual diagram illustrating a disposition configuration example of transistors in a variable current driver circuit in FIG. 15.

DETAILED DESCRIPTION

Figure 1:
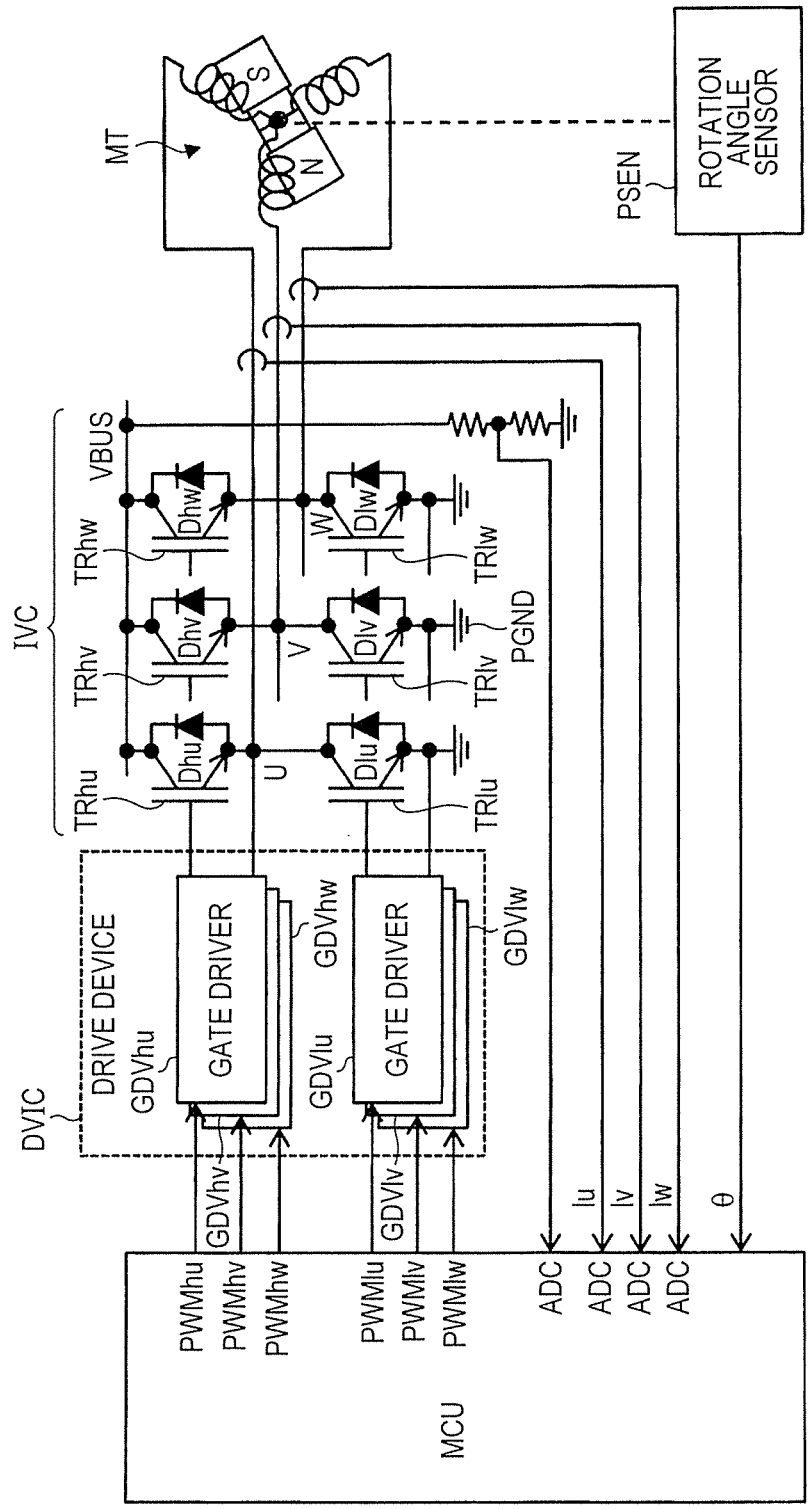
FIG. 1 is a schematic diagram illustrating a general configuration example in a power supply system according to a first embodiment of the present invention.

In the following embodiments, when it is necessary for convenience, an embodiment will be described by being divided to a plurality of sections or examples. Unless otherwise clearly specified, they are not non-related but have relations such as modification, detailed description, and supplementary explanation in which one is a part or all of the other. In the following embodiments, in the case of mentioning the number of elements and the like (including the number of pieces, numerical value, quantity, and range), except for the case where it is clearly mentioned, the case where the invention is principally clearly limited to a specific value, and the like, the invention is not limited to the specific value. The number may be larger or smaller than the specific value.

Further, in the following embodiments, obviously, components (including operation steps) are not always necessary except for the case where it is clearly mentioned, the case where it is considered that a component is principally clearly necessary, and the like. Similarly, in the following embodiments, when shape, position relation, and the like of components are mentioned, they substantially include shape and the like close or similar to them except for the case where it is clearly mentioned, the case where it is considered that the shape and the like are not principally clearly similar. The numerical value and range are also similar to the above.

Hereinafter, embodiments of the present invention will be described in detail with reference to the drawings. In all of the drawings for explaining the embodiments, in principle, the same reference numerals are designated to the same members and repetitive description will not be given.

First Embodiment

General Schematic Configuration of Power Supply System

FIG. 1 is a schematic diagram illustrating a general configuration example of a power supply system according to a first embodiment of the present invention. The power supply system illustrated in FIG. 1 is an inverter system having a microcontroller MCU, a drive device DVIC, and an inverter circuit IVC. The inverter circuit IVC supplies AC power of three phases (u phase, v phase, and w phase) to a load such as a motor MT by PWM (Pulse Width Modulation) control.

The inverter circuit IVC has high-side transistors TRhu, TRhv, and TRhw coupled between a power supply voltage VBUS and three-phase output terminals U, V, and W, respectively, and low-side transistors TRlu, TRlv, and TRlw coupled between a ground power supply voltage PGND and the three-phase output terminals U, V, and W, respectively. In the specification, the power transistors will be generally called power transistors TR. Although the case where each of the power transistors TR is an IGBT in the specification is an example in the specification, the power transistor TR may be an MOSFET or the like. In this case, the collector and the emitter are replaced by the drain and the source.

The power supply voltage VBUS is, for example, a voltage of hundreds V or, in some cases, thousands V and coupled to the collectors of the high-side transistors TRhu, TRhv, and TRhw. The ground power supply voltage PGND is supplied to the emitters of the low-side transistors TRlu, TRlv, and TRlw. To the high-side transistors TRhu, TRhv, and TRhw, freewheel diodes Dhu, Dhv, and Dhw are coupled in parallel, respectively. To the low-side transistors TRlu, TRlv, and TRlw as well, freewheel diodes Dlu, Dlv, and Dlw are coupled in parallel, respectively.

The drive device DVIC has gate drivers GDVhu, GDVlv, and GDVhw driving the high-side transistors TRhu, TRhv, and TRhw, respectively, and gate drivers GDVlu, GDVlv, and GDVlw driving the low-side transistors TRlu, TRlv, and TRlw, respectively. For example, the gate driver GDVhu operates using the emitter of the high-side transistor TRhu as the ground power supply voltage, and drives the gate of the high-side transistor TRhu on the basis of a PWM signal PWMlu from the microcontroller MCU. Similarly, the gate drivers GDVlv and GDVhw also drive the gates of the high-side transistors TRhv and TRhw on the basis of PWM signals PWMlv and PWMlw from the microcontroller MCU, respectively.

On the other hand, for example, the gate driver GDVlu using the emitter of the low-side transistor TRlu as the ground power supply voltage, and drives the gate of the low-side transistor TRlu on the basis of a PWM signal PWMlu from the microcontroller MCU. Similarly, the gate drivers GDVlv and GDVlw also drive the gates of the low-side transistors TRlv and TRlw on the basis of PWM signals PWMlv and PWMlw from the microcontroller MCU, respectively. The microcontroller MCU properly determines the duties of the PWM signals PWMlu, PWMlv, PWMlw, PWMlu, PWMlv, and PWMlw by reflecting, for example, detection results of phase currents Iu, Iv, and Iw in the three-phase output terminals U, V, and W, detection results of rotational angle of the motor MT by a rotational angle sensor PSEN, and the like.

Figure 2A:
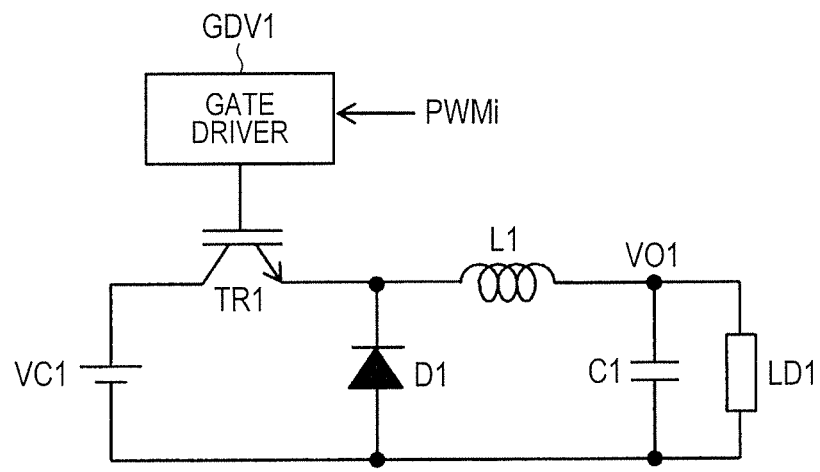
FIGS. 2A and 2B are schematic diagrams illustrating a general configuration example of a power supply system different from that of FIG. 1.
Figure 2B:
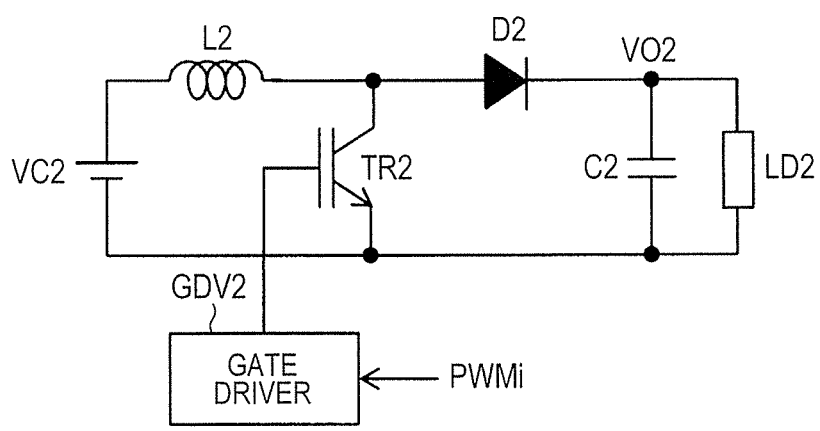

FIGS. 2A and 2B are schematic diagrams illustrating a general configuration example of a power supply system different from that of FIG. 1. The power supply system illustrated in FIGS. 2A and 2B is a switching regulator generating a predetermined power supply by PWM control. FIG. 2A illustrates a step-down converter and FIG. 2B illustrates a boost converter. The step-down converter of FIG. 2A has a gate driver GDV1, a voltage supply VC1, a power transistor TR1, a freewheel diode D1, a coil L1, and a capacitor C1.

The gate driver GDV1 drives the power transistor TR1 on the basis of a PWM signal PWMi from a not-illustrated feedback control circuit. In a period in which the power transistor TR1 is on, drive current flows in a path of the voltage supply VC1→the power transistor TR1→the coil L1, and the capacitor C1. In a period in which the power transistor TR1 is off, return current flows in a path of the coil L1→the capacitor C1→freewheel diode D1. Consequently, an output voltage VO1 obtained by stepping down the voltage of the voltage supply VC1 is supplied to a load LD1.

The boost converter of FIG. 2B has a gate driver GDV2, a voltage supply VC2, a power transistor TR2, a boost diode D2, a coil L2, and a capacitor C2. The gate driver GDV2 drives the power transistor TR2 on the basis of the PWM signal PWMi from a not-illustrated feedback control circuit. In a period in which the power transistor TR2 is on, power is accumulated in the coil L2 by a path of the voltage supply VC2→the coil L2→the power transistor TR2. In a period in which the power transistor TR2 is off, the current of the coil L2 flows to the capacitor C2 via the boost diode D2. Consequently, an output voltage VO2 obtained by boosting the voltage of the voltage supply VC2 is supplied to a load LD2.

In such a power supply system, the on/off state of the power transistor TR is frequently controlled at a switching frequency of, for example, a few kHz to tens kHz on the basis of the PWM signal. Therefore, for improvement in power conversion efficiency, suppression of heat generation, and the like, particularly, it is important to reduce the switching loss. Moreover, from the viewpoint of using the power transistor TR in a safe operation region, it is also important to suppress various spike noises accompanying switching.

Summary of Gate Driver (Comparison Example)

Figure 19:
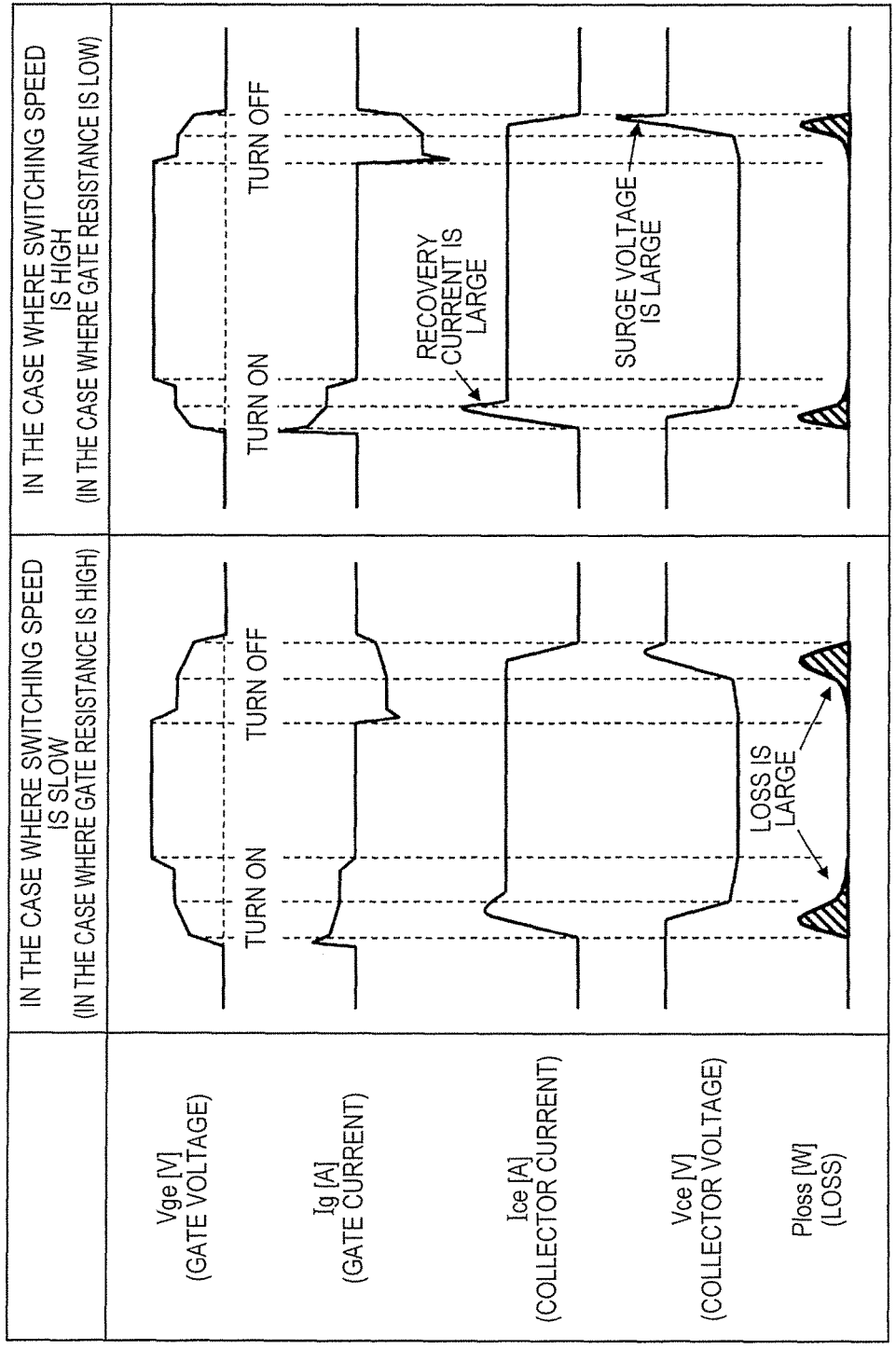
FIG. 19 is a diagram illustrating an example of drive waveforms of the power transistor in the case of using a gate driver as a first comparison example of the present invention.
Figures 20, 21:
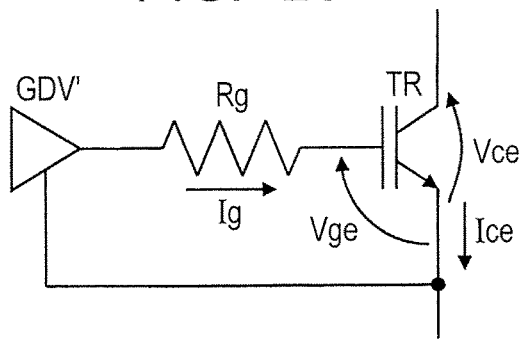
FIG. 20 is a schematic diagram illustrating a configuration example of a periphery of the gate driver in FIG. 19.
FIG. 21 is a table illustrating an example of relations between resistance values of the gate resistor in FIGS. 19 and 20 and various characteristics.

FIG. 19 is a diagram illustrating an example of drive waveforms of the power transistor in the case of using a gate driver as a first comparison example of the present invention. FIG. 20 is a schematic diagram illustrating a configuration example of the circumference of the gate driver in FIG. 19. In general, at the time of driving the power transistor TR, a driving system as illustrated in FIG. 20 is used. In FIG. 20, a gate driver GDV' drives the gate of the power transistor (IGBT) TR via a gate resistor Rg. By adjusting the resistance value of the gate resistor Rg, switching speed of the power transistor TR is adjusted.

As illustrated in FIG. 19, when the switching speed is slow (that is, when the resistance value of the gate resistor Rg is high and the charge/discharge speed of the gate is slow), a state where the power transistor TR is half-on (in other words, behaves as a resistor) becomes long, and switching loss Ploss occurring in the power transistor TR increases. As a result, decrease in power conversion efficiency of the system, increase in cost accompanying a measure against heat dissipation of the power transistor TR, and the like may occur.

On the contrary, when the switching speed is fast (that is, when the resistance value of the gate resistor Rg is low and the charge/discharge speed of the gate is high), inclination (dI/dt) of current Ice between the collector and the emitter and inclination (dV/dt) of voltage Vce between the collector and the emitter increase. When "dI/dt" increases, a large surge voltage (Ls× (dI/dt)) occurs in the collector-emitter voltage Vce by parasite inductance (Ls) in a package, a line, and the like. In this case, excess in withstand voltage or the like in the power transistor TR may occur. Since fluctuations in the magnetic field become large, induced voltage generated in an external circuit, that is, radiation noise also may become large.

On the other hand, when "dV/dt" increases, a situation that recovery current overlapping on the collector-emitter current Ice increases or a situation that an erroneous operation is caused by capacitance coupling may occur. The recovery current is, for example, current accompanying recovery to reverse bias of the freewheel diode Dlu when the high-side transistor TRhu is turned on in a state where the freewheel diode Dlu in FIG. 1 is performing freewheel operation. The faster the turn-on speed is, the larger the recovery current becomes.

In the case of adjusting the switching speed by the resistance value of the gate resistor Rg, the relation of trade-off as illustrated in FIG. 21 occurs. FIG. 21 is a table illustrating an example of relations between resistance values of the gate resistor in FIGS. 19 and 20 and various characteristics and is a summary of the above description. When the resistance value of the gate resistor Rg is determined, a point of compromise is found in consideration of the tradeoff relation.

Figure 22:
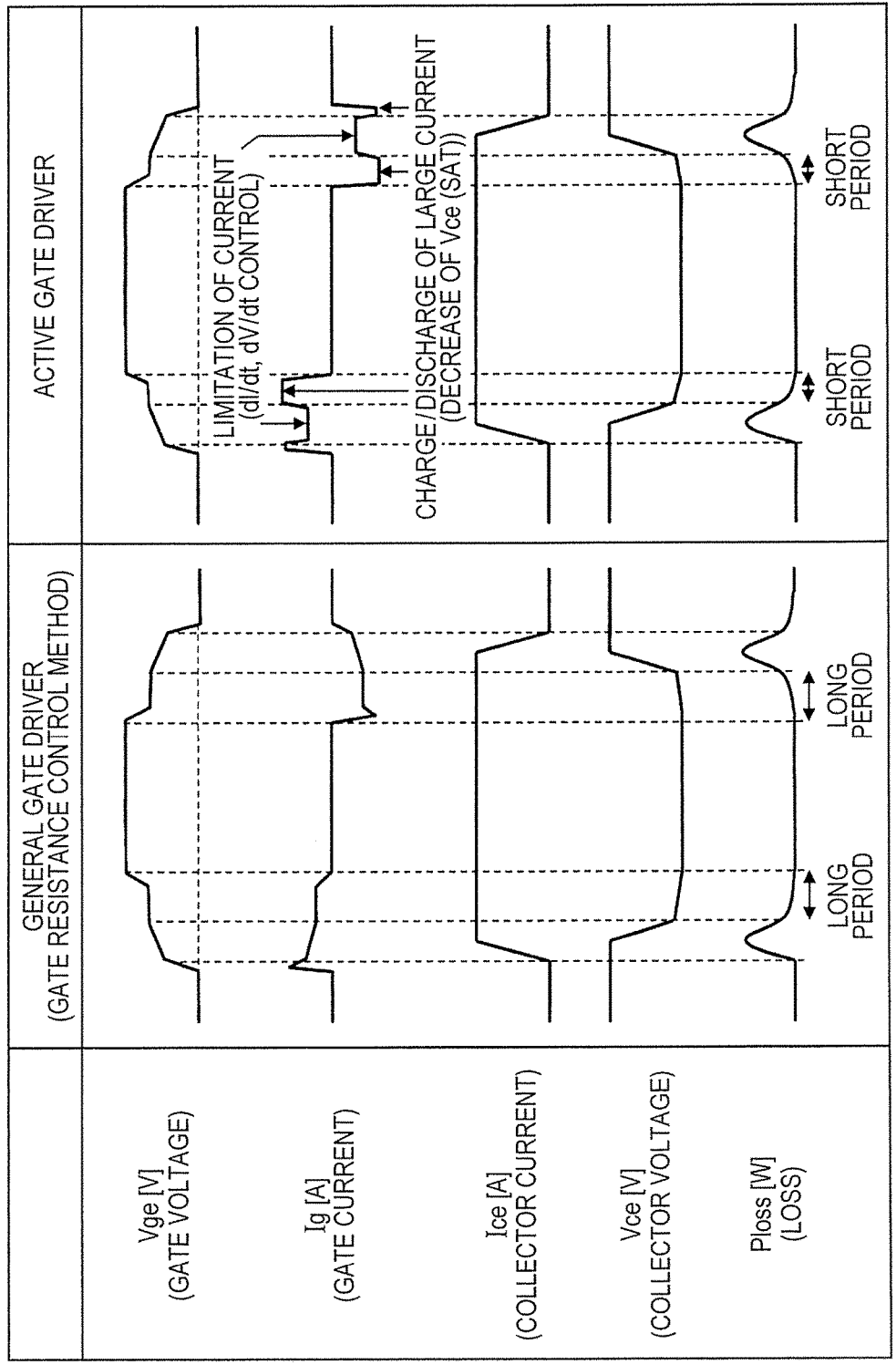
FIG. 22 is a comparison diagram of an example of drive waveforms of a power transistor in the case of using a gate driver as a first comparison example of the present invention and the case of using an active gate driver.

To break the situation which is limited by such a tradeoff, it is beneficial to use an active gate driver. FIG. 22 is a comparison diagram of an example of drive waveforms of a power transistor in the case of using a gate driver as a first comparison example of the present invention and the case of using an active gate driver. As illustrated in FIG. 22, the active gate driver reduces the switching loss Ploss while suppressing the current inclination (dI/dt) as a cause of surge voltage and radiation noise and the voltage inclination (dV/dt) as a cause of an erroneous operation by recovery current and capacitance coupling to proper values.

Concretely, as charge/discharge periods (in other words, switching periods) of the gate of the power transistor TR, there are a period [1] in which influence is exerted on "dI/dt" and "dV/dt" and a period [2] in which influence is exerted on the switching loss without exerting influence on "dI/dt" and "dV/dt". The active gate driver properly suppresses the charge/discharge speed of the gate in the former period [1] and, by charging/discharging the gate as fast as possible, shortens the period in which power is consumed and reduces the switching loss Ploss in the latter period [2]. By actively changing the gate current Ig in such a manner, both the advantage in the case where the resistance value of the gate resistor Rg illustrated in FIG. 21 is high and the advantage in the case where the resistance value of the gate resistor Rg is low can be satisfied.

Figure 23A:
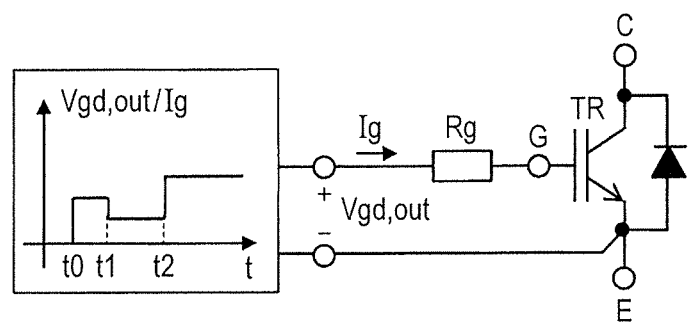
FIGS. 23A and 23B are schematic diagrams each illustrating a configuration example of a gate driver as a second comparison example of the present invention.
Figure 23B:
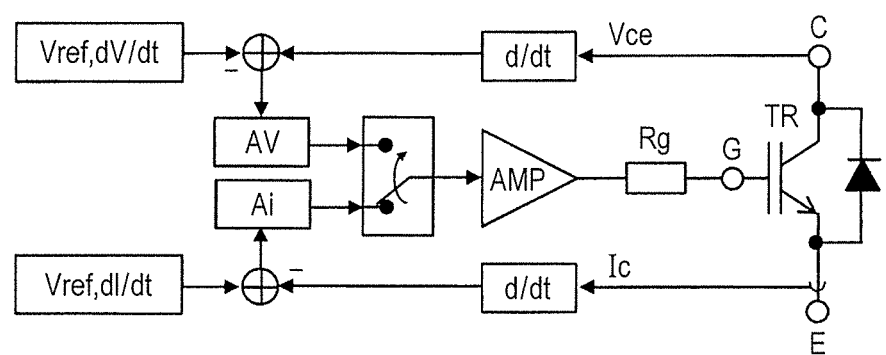

As the configuration of the active gate driver, for example, the configurations as illustrated in FIGS. 23A and 23B are considered. Each of FIGS. 23A and 23B is a schematic diagram illustrating a configuration example of a gate driver as a second comparison example of the present invention. The gate driver of FIG. 23A has a configuration of an open loop type (feedforward type), and the gate driver of FIG. 23B has a configuration of an analog feedback type.

In the configuration of the open loop type, as illustrated in FIG. 23A, the charge/discharge period of the gate G of the power transistor TR is divided to a plurality of intervals (t0 to t1, t1 to t2, t2~) in advance, and the length of each of the intervals and charge/discharge current in each interval are fixedly determined. The configuration can be realized simply at low cost since voltage/current detection circuits for performing feedback, an arithmetic circuit for feedback, and the like are unnecessary. However, since the waveforms of the charge/discharge currents of the gate are determined, it is difficult to follow characteristic fluctuations in the power transistor TR caused by PVT variations such as manufacture variations of parts, voltage fluctuations, and temperature fluctuations, and there is a case that desired performances cannot be obtained.

In the configuration of the analog feedback type, as illustrated in FIG. 23B, an error between the observation result of "dI/dt" and "dV/dt" of the power transistor TR and a target value (Vref) is reflected in an analog amplifier AMP at high speed, and the power transistor TR is driven by the analog amplifier AMP. In the configuration, since an actual observation result is fed back, the PVT variations can be followed. However, since the configuration needs high-speed analog feedback, the high-speed analog amplifier AMP is necessary and, particularly, increase in power consumption is concerned.

For example, even in a relatively large power transistor TR in which hundreds V/hundreds A are turned on/off, to switch current from zero to hundreds A, usually, hundreds ns are sufficient. Therefore, to control "dI/dt" and "dV/dt" to target values while observing them, it is necessary to configure a high-speed feedback loop to make a response within tens ns. Since a high-speed amplifier is generally necessary to configure a high-speed analog feedback loop, power consumption increases. When the power consumption increases, the heat generation of the driver itself increases and, therefore, it becomes difficult to use the system in the environment in which ambient temperature is high. For example, a system driving a motor MT as illustrated in FIG. 1 is often used under high-temperature environment, and increase in power consumption of the driver is undesirable.

In addition, such a high-speed large-current analog circuit occupies a large area on a semiconductor chip, so that the cost of the drive device DVIC including the gate driver is high. Further, from the viewpoint of actual designing, when response speed of the feedback loop is increased, there is the possibility that it becomes difficult to assure stability of the loop.

Outline of Drive Device (First Embodiment)

Figure 3:
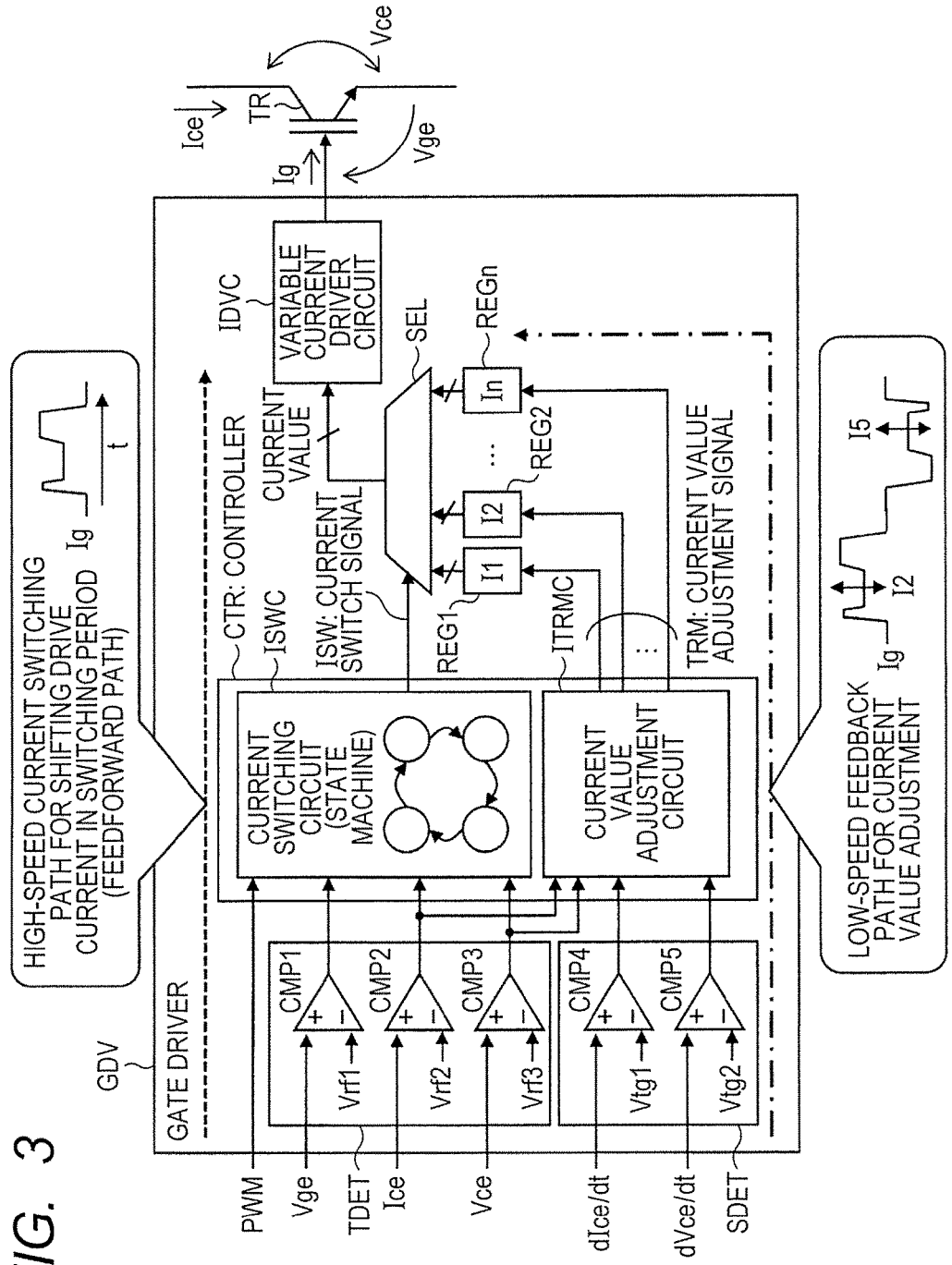
FIG. 3 is a schematic diagram illustrating a configuration example and an operation example of each of gate drivers in a drive device according to the first embodiment of the present invention.

FIG. 3 is a schematic diagram illustrating a configuration example and an operation example of each of gate drivers in a drive device according to the first embodiment of the present invention. A gate driver GDV illustrated in FIG. 3 has a controller CTR, a plurality of registers REG1 to REGn, a selection circuit SEL, a variable current driver circuit IDVC, a trigger detection circuit TDET, and an inclination detection circuit SDET. The controller CTR has a current switching circuit ISWC and a current value adjustment circuit ITRMC.

Each of the plurality of registers REG1 to REGn is a register of, for example, eight bits and hold current values as digital values. In this example, the plurality of registers REG1 to REGn hold current values I1 to In, respectively. The variable current driver circuit IDVC receives a digital value (current value) of any of the plurality of registers REG1 to REGn via the selection circuit SEL and drives the power transistor TR by drive current (gate current Ig) based on the digital value.

The trigger detection circuit TDET monitors voltage between terminals or current between terminals of the power transistor TR in a switching period (in other words, the charge/discharge period of the gate) of the power transistor TR, and detects that the voltage between terminals or the current between terminals reaches a predetermined reference value. Concretely, the trigger detection circuit TDET detects at least one, desirably, all of a collector-emitter voltage Vce, a collector-emitter current Ice, and a gate-emitter voltage Vge of the power transistor TR. In the case where the power transistor TR is an MOSFET, the collector-emitter voltage Vce, the collector-emitter current Ice, and the gate-emitter voltage Vge become a drain-source voltage Vds, a drain-source current Ids, and a gate-source voltage Vgs, respectively.

In the example, the trigger detection circuit TDET has comparison circuits CMP1 to CMP3. The comparison circuit CMP1 detects that the gate-emitter voltage Vge reaches a predetermined reference value Vrf1. Similarly, the comparison circuit CMP2 detects that the collector-emitter current Ice reaches a predetermined reference value Vrf2, and the comparison circuit CMP3 detects that the collector-emitter voltage Vce reaches a predetermined reference value Vrf3.

The inclination detection circuit SDET detects an inclination of the voltage between terminals or the current between terminals of the power transistor TR in the switching period of the power transistor TR. Concretely, the inclination detection circuit SDET detects at least one, desirably, both of an inclination (dVce/dt) of the collector-emitter voltage Vce and/or an inclination (dIce/dt) of the collector-emitter current Ice in the power transistor TR. In this example, the inclination detection circuit SDET has comparison circuits CMP4 and CMP5. The comparison circuit CMP4 detects the magnitude relation between the inclination (dIce/dt) and a preliminarily determined target value Vtg1, and the comparison circuit CMP5 detects the magnitude relation between the inclination (dVce/dt) and a preliminarily determined target value Vtg2.

The current switching circuit ISWC selects a register which outputs a signal to the variable current driver circuit IDVC from the plurality of registers REG1 to REGn by outputting the current switching signal ISW to the selection circuit SEL. Concretely, the current switching circuit ISWC is comprised of, for example, a state machine and shifts the drive current (gate current Ig) of the variable current driver circuit IDVC by switching a register selecting, as a trigger, a detection result of the trigger detection circuit TDET in the switching period of the power transistor TR. The current switching circuit ISWC also uses, as a trigger at the time of switching a register to be selected, a PWM signal PWM from the outside in addition to the detection result of the trigger detection circuit TDET.

The current value adjustment circuit ITRMC feedback-controls current values (I2 and I5) of predetermined registers (for example, REG2 and REG5) in the plurality of registers REG1 to REGn by using the current value adjustment signal TRM so that the detection result of the inclination detection circuit SDET becomes close to a predetermined target value. At this time, the current value adjustment circuit ITRMC obtains, although not limited, timings of fetching a detection result of the inclination detection circuit SDET (that is, the timings of the rise/fall periods of current and voltage) using the detection result of the trigger detection circuit TDET (concretely, the comparison circuits CMP2 and CMP3).

As described above, in practice, the current switching circuit ISWC switches the gate current Ig at high speed by the open loop (feedforward control). That is, not only general feedback control of determining a control amount (analog value) by reflecting an error between a detection result and a target value, a control simply using a detection result as a trigger is used, the feedforward control is performed in practice. Since the switching of the gate current Ig is performed a plurality of times in one turn-on period or turn-off period (for example, hundreds ns) of the power transistor in practice, an open loop in which high-speed operation is possible is used.

On the other hand, the current value adjustment circuit ITRMC adjusts the current value of a predetermined register by the feedback control by reflecting each of an error between the inclination (Vce/dt) and the target value and an error between the inclination (Ice/dt) and the target value. That is, a feedback loop is formed such that the magnitude of the gate current Ig is determined by the value of the register, "Vce/dt" and "Ice/dt" change according to the gate current Ig, and the value of the register is adjusted by reflecting an error between the detection result and the target value.

After the value of the register is adjusted once to a proper value, only minor correction is sufficient. Consequently, it is unnecessary to change the value at high speed, and the speed of the feedback may be low. Concretely, the switching frequency of the PWM signal of the power transistor TR is about tens kHz (for example, 20 kHz), and on/off operation is performed in cycles of 50 μs (=½₀ kHz). Tracking time of the feedback loop may be equal to or longer than several times of the time, for example, about 1 ms. The bandwidth of the feedback loop may be about 1 kHz.

The configuration example of FIG. 3 can be regarded as a control system of double loops made by an inner loop accompanying the operation of the current switching circuit ISWC and an outer loop accompanying the operation of the current value adjustment circuit ITRMC. In general, in the double loop, to perform stable feedback control, the loop bandwidth of the outer loop is determined to ⅓ or less of the loop bandwidth of the inner loop. Therefore, the loop bandwidth of the feedback control by the current value adjustment circuit ITRMC is desirably determined to ⅓ or less of the switching frequency of the power transistor TR and may be, actually, ¹⁄₁₀₀, ¹⁄₁₀₀₀, or the like. It is also possible to configure so that initial values of the reference values Vrf1 to Vrf3, the target values Vtg1 and Vtg2, current values I1 to In, and the like in FIG. 3 can be programmed from the outside.

FIG. 4 is a diagram illustrating an example of schematic drive waveforms of a power transistor by the drive device of FIG. 3. The current switching circuit ISWC switches the current value of the gate current Ig at high speed on the basis of a plurality of triggers detected in one turn-on period or one turn-off period as illustrated in FIG. 4. The trigger is a result of comparison between the voltage (Vge, Vce) between terminals and the reference value and the current (Ice) between terminals and the reference value by a turn-off instruction and a turn-on instruction based on transition of the input PWM signal PWM.

As described above, different from the feedforward control in the case of FIG. 23A, the current switching circuit ISWC does not switch the gate current Ig at a preliminarily fixed timing but switches the gate current Ig on the basis of a trigger from the trigger detection circuit TDET or the like. The timing when the trigger occurs changes according to the PVT variations of the power transistor TR or the like. Therefore, different from the case of FIG. 23A, the current switching circuit ISWC can switch the current at a timing in which the PVT variations of the power transistor TR or the like are reflected.

In FIG. 4, it is particularly important to switch the current so as to suppress the gate current Ig while the collector-emitter voltage Vce and the collector-emitter current Ice change. The current switching process is performed at high speed by the current switching circuit ISWC. On the other hand, the current value (for example, 12 or 15) after the switching is adjusted at low speed by the current value adjustment circuit ITRMC.

Concretely, the inclination detection circuit SDET detects the magnitude relations between the inclination (dVce/dt) of the collector-emitter voltages and the inclination (Ice/dt) of the collector-emitter currents Ice in the turn-on period and the turn-off period and the target values. The current value adjustment circuit ITRMC accumulates a plurality of detection results (that is, magnitude relations) by the inclination detection circuit SDET and adjusts current values of predetermined registers (for example, REG2 and REG5) on the basis of a total value of the accumulated results. That is, the current value adjustment circuit ITRMC adjusts the current value over time by reflecting the detection results on a plurality of (for example, ten times, hundred times, or thousand time) turn-on periods and turn-off periods in the past.

As described above, at the time of adjustment of the current value, the high-speed feedback control of detecting the present inclinations ("dVce/dt" and "Ice/dt") and promptly reflecting the error between each of the inclinations and the target value in the present gate current Ig like in the case of FIG. 23B is not performed but low-speed feedback control is performed. By using the low-speed feedback control, different from the case of FIG. 23B, a high-speed amplifier is not necessary, and reduction in the power consumption, reduction in the chip are, and the like are realized. Further, assurance of stability of the feedback loop becomes easier.

Details of Drive Device (First Embodiment)

Figure 5A:
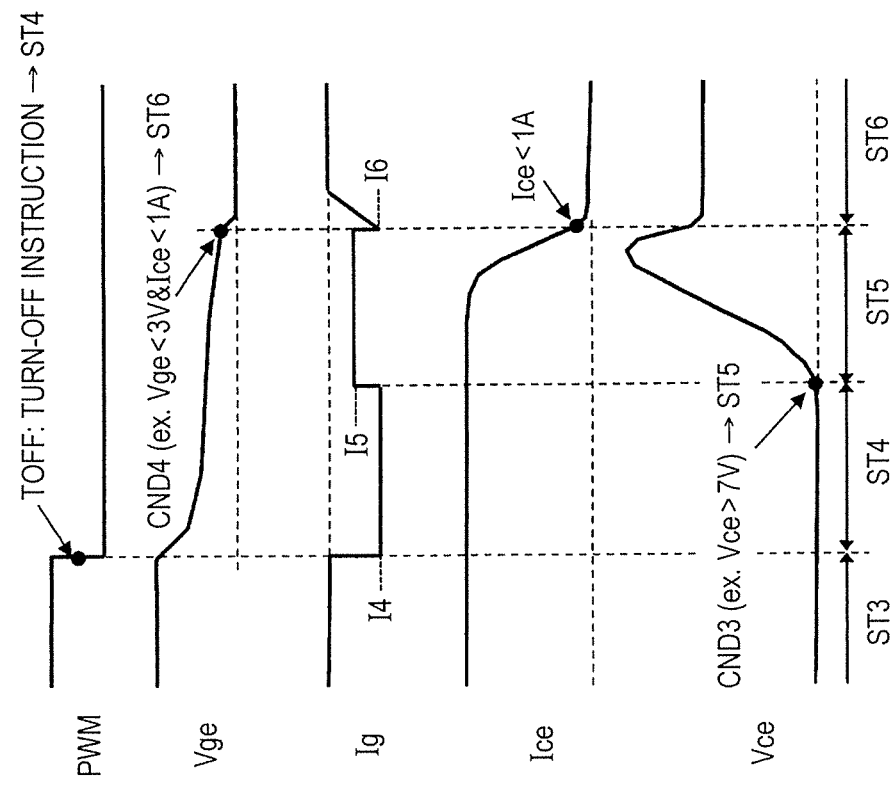
FIG. 5A is a diagram illustrating an example of detailed drive waveforms at the time of turn-on of a power transistor in FIG. 4.
Figure 5B:
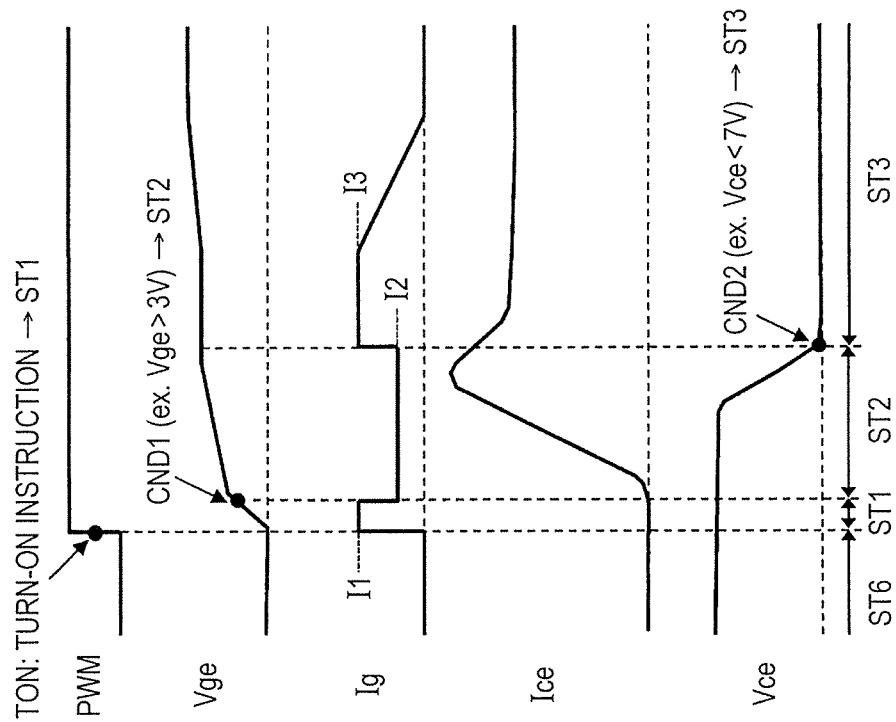
FIG. 5B is a diagram illustrating an example of detailed drive waveforms at the time of turn-off of a power transistor in FIG. 4.

FIG. 5A is a diagram illustrating an example of detailed drive waveforms at the time of turn-on of the power transistor in FIG. 4, and FIG. 5B is a diagram illustrating an example of detailed drive waveforms at the time of turn-off of the power transistor in FIG. 4.

In FIG. 5A, the current switching circuit ISWC shifts to a state 1 (ST1) using a turn-on instruction TON based on the PWM signal PWM from the outside as a trigger, and executes a process of selecting the register REG1 as a process of the state 1 (ST1). Accordingly, the variable current driver circuit IDVC charges the gate of the power transistor TR with the gate current (in this case, source current of the source/sink) Ig of the current value I1, and the gate-emitter voltage Vge of the power transistor TR rises. The current value I1 held in the register REG1 is, for example, a maximum source current value based on a preliminarily determined fixed value.

Subsequently, the trigger detection circuit TDET (concretely, the comparison circuit CMP1) detects that the gate-emitter voltage Vge rises to the reference value Vrf1 (for example, 3V). The current switching circuit ISWC shifts to a state 2 (ST2) using the detection result as a trigger condition CND1 and executes, as a process of the state 2 (ST2), a process of switching a register to be selected from the register REG1 to the register REG2. In response, the variable current driver circuit IDVC charges the gate of the power transistor TR with the gate current Ig of the current value I2 (|I2|<|I1|) and controls the inclination when the collector-emitter current Ice of the power transistor TR rises.

As described above, the current switching circuit ISWC charges mainly gate-emitter capacitance (Cge) with large current at high speed until the gate-emitter voltage Vge reaches a predetermined transistor threshold value (Vth). At a time around the voltage reaches the transistor threshold value (Vth) (for example, just before it reaches the transistor threshold value (Vth)), the current switching circuit ISWC suppresses the inclination (dIce/dt) of the collector-emitter current Ice by decreasing the current value to reduce overshoot by recovery current or the like. Although the gate-emitter voltage Vge is used as the trigger condition CND1 to the state 2 (ST2), alternatively, it is also possible to detect the rise start of the collect-emitter current Ice and use it as the trigger condition CND1.

After that, the freewheel diode on the opposed side (for example, Dlu in the case of turning on TRhu in FIG. 1) recovers to the reverse bias, and the collector-emitter voltage Vce falls. Accompanying the fall of the collector-emitter voltage Vce, the gate current Ig of the current value I2 is used mainly for charging gate-collector capacitance (mirror capacitance) Cgc. As a result, a so-called mirror plateau period in which the gate-emitter voltage Vge is almost flat occurs.

Subsequently, the trigger detection circuit TDET (concretely, the comparison circuit CMP3) detects that the collector-emitter voltage Vce falls to the reference voltage Vrf3 (for example, 7V). The current switching circuit ISWC shifts to a state 3 (ST3) using the detection result as a trigger condition CND2 and executes a process of switching a register to be selected from the register REG2 to the register REG3 as a process of the state 3 (ST3). In response, the variable current driver circuit IDVC charges the gate of the power transistor TR at high speed with the gate current Ig of the current value I3 (|I3|<|I2|).

As described above, in the state 3 (ST3), the current switching circuit ISWC shortens the charge period (mirror plateau period) of the mirror capacitance and reduces power loss by promptly making the collector-emitter voltage Vce close to the 0V level. In the state 3 (ST3), the period in which the gate current (source current) Ig decreases is not a period in which current is actively controlled but a period in which current is passively controlled accompanying time close to completion of charging.

On the other hand, in FIG. 5B, the current switching circuit ISWC shifts to a state 4 (ST4) using the turn-off instruction TOFF based on the PWM signal PWM from the outside as a trigger and executes a process of selecting the register REG4 as a process of the state 4 (ST4). Accordingly, the variable current driver circuit IDVC discharges the gate of the power transistor TR with the gate current (in this case, sink current of source/sink) Ig of the current value I4, and the gate-emitter voltage Vge of the power transistor TR falls. In response, the collector-emitter voltage Vce of the power transistor TR rises. The current value I4 held in the register REG4 is, for example, the maximum sink current value based on a preliminarily determined fixed value.

Subsequently, the trigger detection circuit TDET (concretely, the comparison circuit CMP3) detects that the collector-emitter voltage Vce rises to the reference voltage Vrf3 (for example, 7V). The current switching circuit ISWC shifts to a state 5 (ST5) using the detection result as a trigger condition CND3 and executes a process of switching a register to be selected from the register REG4 to the register REG5 as a process of the state 5 (ST5). In response, the variable current driver circuit IDVC discharges the gate of the power transistor TR with the gate current Ig of the current value I5 (|I5|<|I4|) and controls an inclination when the collector-emitter voltage Vce of the power transistor TR rises.

As described above, the current switching circuit ISWC discharges the gate-emitter capacitance (Cge) and the gate-collector capacitance (Cgc) with large current at high speed until the collector-emitter voltage Vce starts rising. When the collector-emitter voltage Vce starts rising, the current switching circuit ISWC decreases the inclination (dVce/dt) of the collector-emitter voltage Vce by decreasing the current value to reduce overshoot by surge voltage or the like.

After that, when the collector-emitter voltage Vce rises sufficiently, the freewheel diode on the opposed side is switched to the forward bias, and fall of the collector-emitter current Ice starts. The trigger detection circuit TDET (concretely, the comparison circuit CMP2) detects that the collector-emitter current Ice falls to the reference voltage Vrf2 (for example, 1 A). Alternatively, the trigger detection circuit TDET (concretely, the comparison circuit CMP1) detects that the gate-emitter voltage Vge falls to the reference value Vrf1 (for example, 3V).

The current switching circuit ISWC shifts to a state 6 (ST6) using one or both of the detection results as a trigger condition CND4 and executes a process of switching a register to be selected from the register REG5 to the register REG6 as a process of the state 6 (ST6). In response, the variable current driver circuit IDVC discharges the gate of the power transistor TR with the gate current Ig of the current value I6 (|I6|>|I5|). By the operation, the current switching circuit ISWC makes the gate-emitter voltage Vge close to the 0V level at high speed, equivalently decreases the impedance of the gate, and erroneous turn-on of the power transistor TR and the like is prevented.

In the state 6 (ST6), the period in which the gate current (sink current) Ig decreases is not a period in which current is actively controlled but a period in which current is passively controlled accompanying time close to completion of charging. The current value adjustment circuit ITRMC fetches a comparison result between the inclination (dIce/dt) of the collector-emitter current Ice and the target value and a comparison result between the inclination (dVce/dt) of the collector-emitter voltage Vce and the target value in the state 2 (ST2) and the state 5 (ST5) and reflect the comparison results in the current values I2 and I5 in the subsequent cycle.

Figure 6:
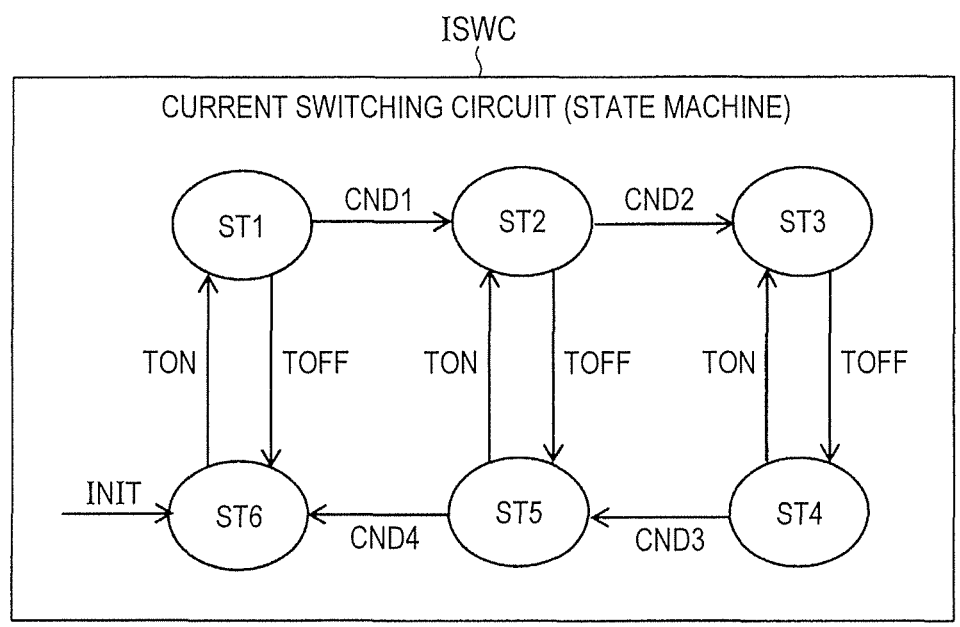
FIG. 6 is a state transition diagram illustrating an example of an operation sequence of a current switching circuit in the drive device of FIG. 4.

FIG. 6 is a state transition diagram illustrating an example of an operation sequence of a current switching circuit in the drive device of FIG. 4. For example, the current switching circuit ISWC is comprised of a state machine performing operations as illustrated in FIG. 6. The processes in the states 1 to 6 (ST1 to ST6) and the trigger conditions at the time of transition of the state in FIG. 6 are as described with reference to FIGS. 5A and 5B.

In addition, in FIG. 6, when an instruction INIT of operation start by power-on or the like is received, the current switching circuit ISWC shifts to, for example, the state 6 (ST6) and starts the operation from the state where the power transistor TR is driven to off. Although not limited, when the turn-off instruction TOFF is received in the states 1, 2, and 3 (ST1, ST2, and ST3), the current switching circuit ISWC shifts to the states 6, 5, and 4 (ST6, ST5, and ST4), respectively. On the contrary, when the turn-on instruction TON is received in the states 6, 5, and 4 (ST6, ST5, and ST4), the current switching circuit ISWC shifts to the states 1, 2, and 3 (ST1, ST2, and ST3), respectively.

Although the current switching circuit ISWC operates in the six states 1 to 6 (ST1 to ST6) in the examples of FIGS. 5A and 5B and FIG. 6, the invention is not limited to the operation. The current switching circuit ISWC may operate in two or more states in each of the turn-on period and the turn-off period. For example, in some cases, the state 1 (ST1) and the state 3 (ST3) can be made common as a state using a maximum source current value, and the state 4 (ST4) and the state 6 (ST6) can be made common as a state using a maximum sink current value.

The registers used in the states can be also properly changed. For example, the register REG3 can be used commonly with the register REG1, and the current value I1 of the register REG1 can be commonly used in the state 1 (ST1) and the state 3 (ST3). Similarly, the register REG6 can be used commonly with the register REG4, and the current value I4 of the register REG4 can be commonly used in the state 4 (ST4) and the state 6 (ST6).

Details of Main Part of Power Supply System

Figure 7:
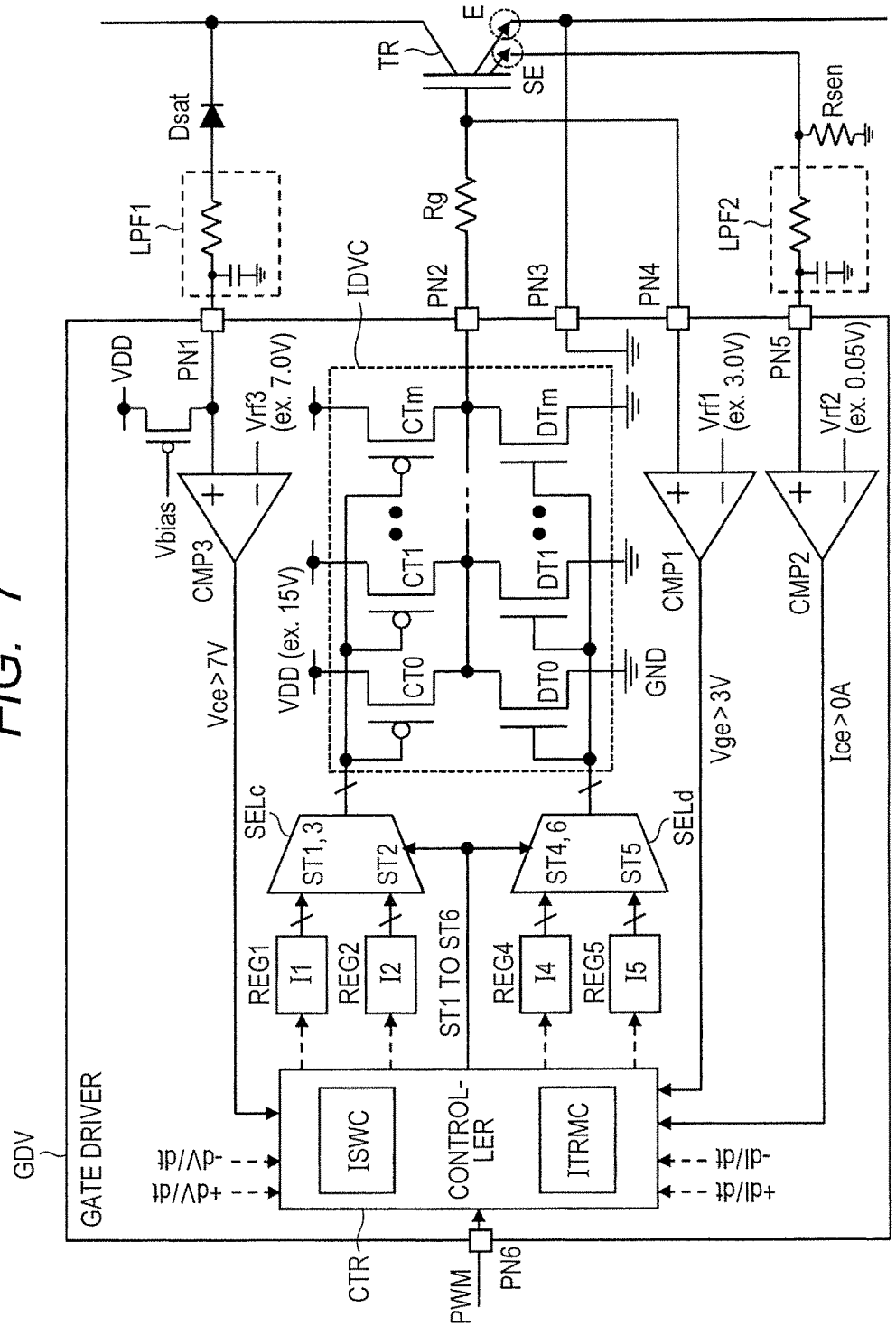
FIG. 7 is a circuit block diagram illustrating a configuration example of a main part in which attention is paid to trigger detection in the power supply system according to the first embodiment of the present invention.

FIG. 7 is a circuit block diagram illustrating a configuration example of a main part in which attention is paid to trigger detection in the power supply system according to the first embodiment of the present invention. In FIG. 7, the power transistor TR, the gate driver GDV included in the drive device DVIC, and various circuits between the power transistor TR and the gate driver GDV are illustrated. The power transistor TR supplies power to a predetermined load, and the gate driver GDV is comprised of, for example, a single semiconductor chip and drives the power transistor TR on the basis of the PWM signal PWM.

The gate driver GDV has a plurality of external terminals PN1 to PN6. To the external terminal PN6, the PWM signal PWM is input. As described above, the controller CTR controls selection circuits SELc and SELd in accordance with the states 1 to 6 (ST1 to ST6) and outputs the current value of a predetermined register to the variable current driver circuit IDVC. In this example, the selection circuit SELc outputs the current value accompanying charging (states 1 to 3 (ST1 to ST3)) and the selection circuit SELd outputs the current value accompanying discharging (states 4 to 6 (ST4 to ST6)). In this example, the current value I1 of the register REG1 is commonly used in the state 1 (ST1) and the state 3 (ST3), and the current value I4 of the register REG4 is commonly used in the state 4 (ST4) and the state 6 (ST6).

The external terminal PN1 is coupled to the comparison circuit CMP3 and the collector of the power transistor TR. The collector of the power transistor TR is, for example, coupled to the external terminal PN1 via a blocking diode Dsat and a low-pass filter LPF1 mounted on a print wiring board or the like. The blocking diode Dsat is a high-withstand-voltage diode.

The collector-emitter voltage Vce shifts between almost 0V level and the power supply voltage (for example, 400V) level of the power transistor TR in accordance with the on/off state of the power transistor TR. On the other hand, the gate driver GDV operates on, for example, the power supply voltage VDD of 15V or the like. Therefore, by the withstand voltage of the gate driver GDV, the power supply voltage level of 400V or the like cannot be directly input to the comparison circuit CMP3. Consequently, the blocking diode Dsat is provided and a bias circuit for passing a small bias current to the blocking diode Dsat is provided for the input node of the comparison circuit CMP in the gate driver GDV.

When the collector-emitter voltage Vce is lower than the power supply voltage VDD of the gate driver GDV, a voltage obtained by adding forward voltage (VF) of the blocking diode Dsat to the collector-emitter voltage Vce becomes input voltage to the comparison circuit CMP3. Consequently, the comparison circuit CMP3 can detect that the collector-emitter voltage Vce has reached the reference value Vrf3 of 7V or the like. On the other hand, when the collector-emitter voltage Vce is higher than the power supply voltage VDD, the blocking diode Dsat becomes reverse bias. As a result, to the input node of the comparison circuit CMP3, a voltage equal to or higher than the power supply voltage VDD is not applied. The low-pass filter LPF1 absorbs the recovery current of the blocking diode Dsat and plays the role of protection so that overvoltage is not applied to the gate driver GDV.

The external terminal PN2 is coupled to the variable current driver circuit IDVC and the gate of the power transistor TR. The variable current driver circuit IDVC has a plurality of charge transistors CT0 to CTm provided in parallel between the power supply voltage VDD and the external terminal PN2 and a plurality of discharge transistors DT0 to DTm provided in parallel between the ground power supply voltage GND and the external terminal PN2. In the specification, the plurality of charge transistors CT0 to CTm will be generally called as charge transistors CT, and the plurality of discharge transistors DT0 to DTm will be generally called as discharge transistors DT. For example, the charge transistor CT is configured as a p-channel-type MOSFET, and the discharge transistor DT is configured as an n-channel-type MOSFET.

The number of on times of the plurality of charge transistors CT0 to CTm is controlled on the basis of a current value (digital value) from the selection circuit SELc, and the number of on times of the plurality of discharge transistors DT0 to DTm is controlled on the basis of a current value (digital value) from the selection circuit SELd. More specifically, the selection circuit SELc decodes the digital value, thereby generating an on/off signal of each of the charge transistors CT0 to CTm. The selection signal SELd also decodes the digital value, thereby generating an on/off signal of each of the discharge transistors DT0 to DTm.

The external terminal PN2 is, for example, coupled to the gate of the power transistor TR via the gate resistor Rg mounted on a print wiring board or the like. When the method of the first embodiment is used, the inclination of the voltage and current can be controlled in place of the gate resistor Rg. Consequently, from this viewpoint, the resistor Rg can be eliminated. It is, however, beneficial to separately provide the resistor Rg for the following reason.

The gate resistor Rg can play, in addition to the role (1) of adjusting the inclinations of the voltage and current, the role (2) as a damping resistor for preventing oscillation accompanying parasitic capacitance and a parasitic inductor in the power transistor TR and its coupling wire, and (3) the role of releasing heat generated in the semiconductor chip. Regarding (3), for example, a case of controlling the charge transistor CT to be on is assumed. In this case, the power supply voltage VDD is divided by the on resistance of the charge transistor CT and the gate resistor Rg on the outside of the chip, so that heat generation in the charge transistor CT can be reduced.

It is consequently beneficial to separately provide the gate resistor Rg to make the gate resistor Rg play the above-described roles (2) and (3). In the case where the method of the first embodiment is not used (that is, the gate resistor Rg is also made play the role (1)), the resistance value of the gate resistor Rg is determined to five to ten Ω or the like. However, in the case of using the method of the first embodiment, for example, the resistance value of the gate resistor Rg is determined to a value (1 to 2Ω or the like) which is half or less of the value of the above case.

The external terminal PN3 is coupled to a main emitter E of the power transistor TR and used as the terminal for the ground power supply voltage GND of the gate driver GDV. The external terminal PN4 is coupled to the comparison circuit CMP1 and the gate of the power transistor TR, and serves as a detection terminal of the gate-emitter voltage Vge. The external terminal PN5 is coupled to the comparison circuit CMP2 and serves as a detection terminal of the collector-emitter current Ice.

Specifically, for example, in the case where the power transistor TR is an IGBT of a multi-emitter type having a sense emitter SE, sense current from the sense emitter SE is converted to voltage by a sense resistor Rsen and the voltage is input to the external terminal PN5. The voltage converted by the sense resistor Rsen may be input to the external terminal PN5 via a low-pass filter LPF2 for reducing noise. A method of detecting the collector-emitter current Ice is not limited to the method by the sense emitter SE but may be a method of sensing the current of the main emitter E by a sense resistor, a method using a Hall element or a magnetoresistance effect element (MR element), a method of using a current transformer, or the like.

Figure 8:
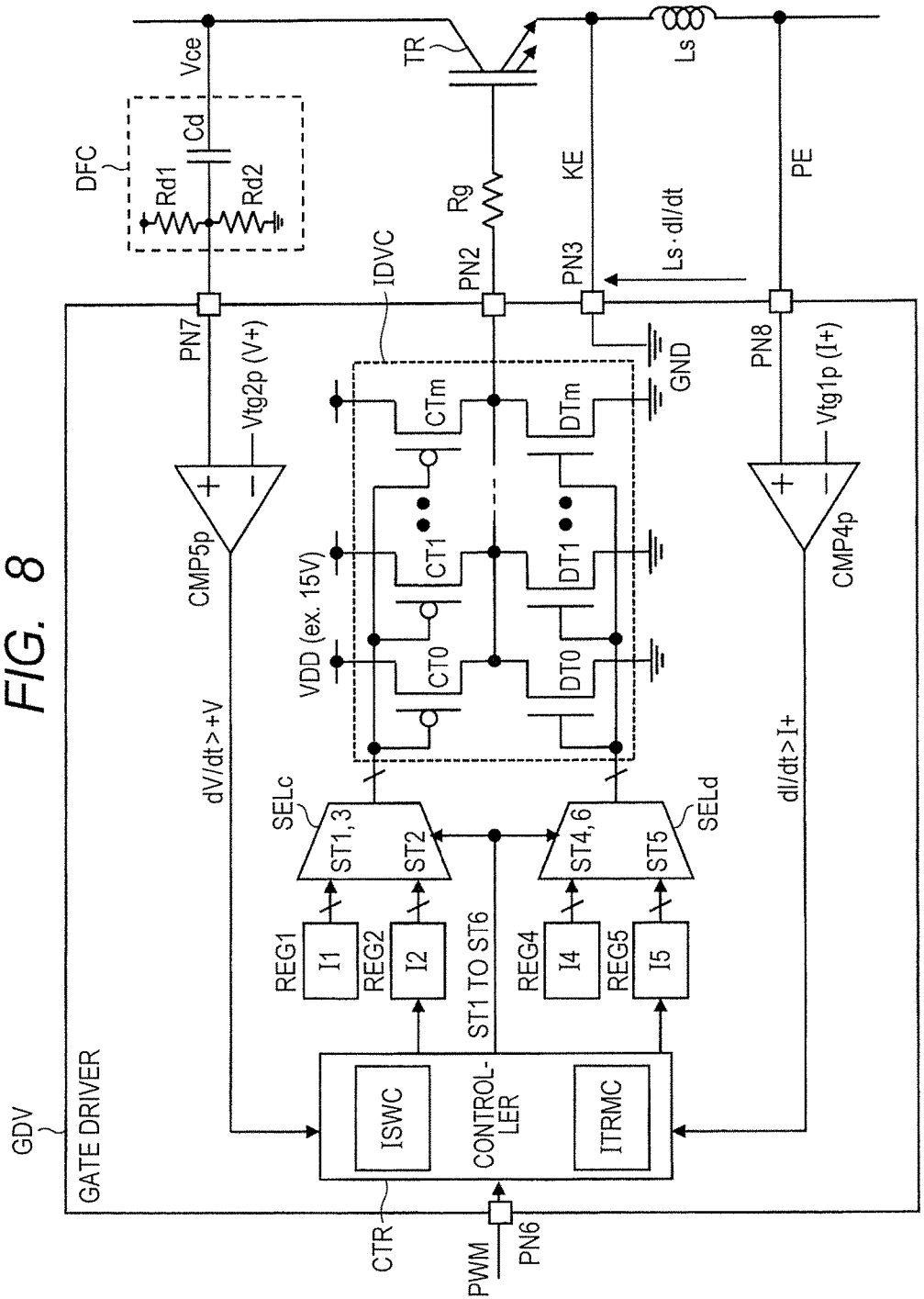
FIG. 8 is a circuit block diagram illustrating a configuration example of a main part in which attention is paid to inclination detection in the power supply system according to the first embodiment of the present invention.

FIG. 8 is a circuit block diagram illustrating a configuration example of a main part in which attention is paid to inclination detection in the power supply system according to the first embodiment of the present invention. Although the gate driver GDV illustrated in FIG. 8 is not partly illustrated, it has the external terminals PN1 to PN6 illustrated in FIG. 7 and their peripheral circuits and, in addition, external terminals PN7 and PN8. The external terminal PN7 is coupled to a comparison circuit CMP5$p$ and the collector of the power transistor TR. The collector of the power transistor TR is, for example, coupled to the external terminal PN7 via a differentiation circuit DFC mounted on a print wiring board or the like.

The differentiation circuit DFC has a capacitor Cd inserted in series between the external terminal PN7 and the collector of the power transistor TR and resistors Rd1 and Rd2 inserted in parallel, and outputs a voltage in which the inclination (dVce/dt) of the collector-emitter voltage Vcc is reflected to the external terminal PN7. Although not limited, the capacitance of the capacitor Cd is tens pF, and the resistance value of each of the resistors Rd1 and Rd2 is a few Ω. The comparison circuit CMP5$p$ detects the magnitude relation between the inclination (dVce/dt) of the collector-emitter voltage Vce as an output voltage of the differentiation circuit DFC and a target value Vtg2$p$(V+) of a preliminarily determined rise slope.

The external terminal PN8 is coupled to the comparison circuit CMP4$p$ and a power emitter (power terminal) PE of the power transistor TR. The external terminal PN3 is coupled to a Kelvin emitter (Kelvin terminal) KE of the power transistor TR. Between the Kelvin emitter KE and the power emitter PE, a parasitic inductance component (Ls) caused by wires of the print wiring board, a lead frame or bonding wire in the package of the power transistor TR, and the like exists.

Therefore, in the power emitter PE, a voltage (Ls×(dIce/dt)) in which the inclination (dIce/dt) of the collector-emitter current Ice is reflected by using the Kelvin emitter KE as a reference is generated. The comparison circuit CMP4$p$ operates using the voltage of the Kelvin emitter KE as the ground power supply voltage GND and detects the magnitude relation between the voltage (Ls×(dIce/dt)) generated in the power emitter PE and a preliminarily determined target value Vtg1$p$(I+) of the rise slope.

FIGS. 9A and 9B are schematic diagrams illustrating a configuration example of the power transistor in FIG. 8. As illustrated in FIG. 9A, the power transistor (IGBT) TR is formed on a semiconductor chip CHP. On the surface of the semiconductor chip CHP, an emitter pad EP, a gate pad GP, and a sense emitter pad SEP are formed. The semiconductor chip CHP is sealed with a package PKG having external terminals (leads or lead frame) PN_GT, PN_PE, PN_SE, PN_KE, and PN_CR.

The external terminals PN_GT, PN_PE, and PN_SE are a gate terminal, the power emitter (PE), and the sense emitter terminal (SE), respectively, and coupled to the gate pad GP, the emitter pad EP, and the sense emitter pad SEP, respectively, via bonding wires BW. The external terminal PN_KE is the Kelvin emitter terminal (KE) and is coupled to the emitter pad EP via the bonding wire BW. The external terminal PN_CR is a collector terminal and coupled to a collector pad formed on the rear face of the semiconductor chip CHP.

The power emitter terminal (PE) is a terminal for supplying power to a predetermined load and is a terminal to which almost all of the collector-emitter current Ice flows. On the other hand, the Kelvin emitter terminal (KE) is a terminal for supplying the ground power supply voltage GND to the gate driver GDV and, substantially, a terminal in which the collector-emitter current Ice does not flow. Therefore, the power emitter terminal (PE) has, equivalent, the parasitic inductance component (Ls) contributing to the collector-emitter current Ice as a parasitic inductance component caused by the bonding wire BW, an external terminal, or the like, and the Kelvin emitter terminal (KE) does not have it.

As illustrated in FIG. 9B, usually, the power transistor (IGBT) TR is comprised of a plurality of unit IGBTs formed in the semiconductor chip CHP and configured by commonly coupling the collectors and the gates of the plurality of unit IGBTs. A part of the plurality of unit IGBTs (for example, 1/1000) is a sense power transistor TRs and the rest is a main power transistor TRm. The emitter of the sense power transistor TRs is coupled to the external terminal PN_SE as the sense emitter SE, and the emitter of the main power transistor TRm is coupled to the external terminal PN_PE which becomes the power emitter PE.

For example, in the case of using the power transistor TR having no Kelvin emitter KE, it is sufficient to separately provide, for instance, a wire corresponding to the Kelvin emitter KE on the print wiring board. For example, it is sufficient to draw a wire for grounding and a wire for a main current path from the emitter terminal of the power transistor TR on the print wiring board, couple the former wire to the gate driver GDV, and couple the latter wire to the date driver GDV so as to be branched from the tip of the part drawn only by predetermined length.

Details of Current Value Adjustment Circuit

Figure 10A:
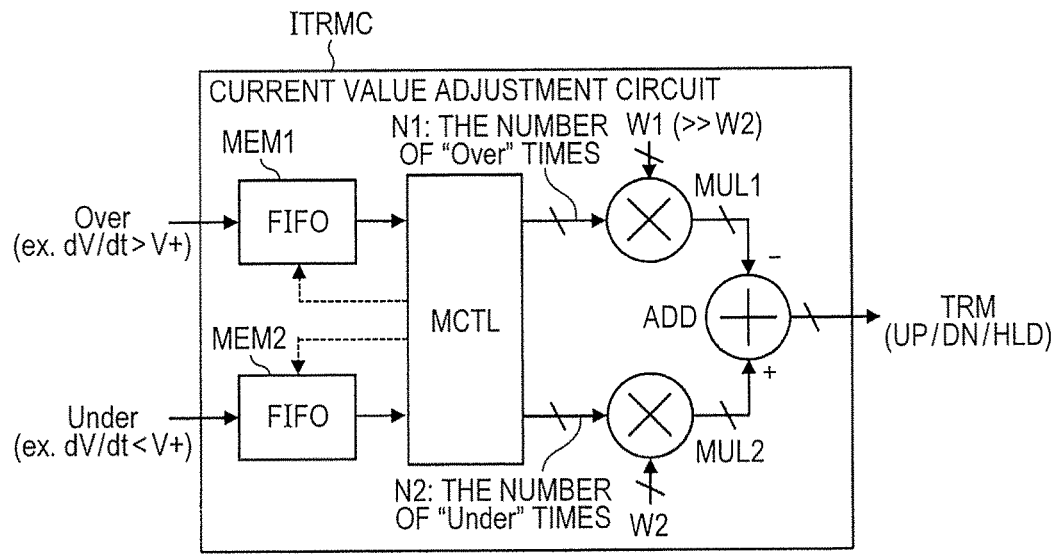
FIG. 10A is a schematic diagram illustrating a configuration example of a main part of a current value adjustment circuit in the drive device of FIG. 3, and FIGS. 10B and 10C are supplemental diagrams explaining the operation example of FIG. 10A.
Figure 10B:
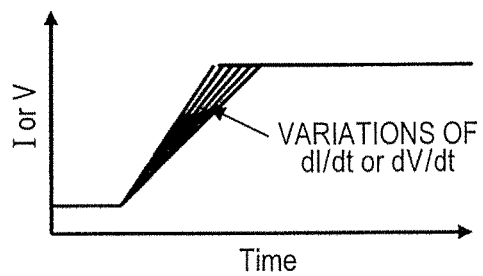
Figure 10C:
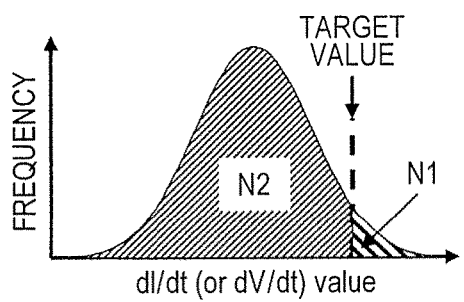

FIG. 10A is a schematic diagram illustrating a configuration example of a main part of a current value adjustment circuit in the drive device of FIG. 3, and FIGS. 10B and 10C are supplemental diagrams explaining the operation example of FIG. 10A. The current value adjustment circuit ITRMC illustrated in FIG. 10A has, for example, memories MEM1 and MEM2 such as FIFOs (First In First Out), a memory control circuit MCTL, multipliers MUL1 and MUL2, and an adder ADD.

First, the operation method of the current value adjustment circuit ITRMC will be described. A comparison result by each of the comparison circuits CMP4 and CMP5 in FIG. 3 is a binary value ("0" or "1") expressing the magnitude relation. As illustrated in FIG. 10B, the voltage inclination (dVce/dt) and the current inclination (dIce/dt) at the turn-on and turn-off of each time have variations to some extent as illustrated in FIG. 10B. As illustrated in FIG. 10C, distribution occurs in the relation between the value of "dVce/dt" or "dIce/dt" and occurrence frequency. Further, also in the comparison circuits CMP4 and CMP5, offset voltage is generated between two inputs depending on time by thermal noise or 1/f noise, and the offset voltage has normal distribution. For example, when the same voltage is applied to the two inputs, output becomes "0" with a probability of 50% and becomes "1" with a probability of 50%.

By applying the phenomenon, not a binary value but linearity is obtained from the comparison results of the comparison circuits CMP4 and CMP5. For example, when "dVce/dt" or "dIce/dt" matches a target value, the comparison circuits CMP4 and CMP5 output "0" with a probability of 50% and output "1" with a probability of 50%. When "dVce/dt" or "dIce/dt" is slightly deviated from the target value, a change occurs in the ratio of "0" and "1". By statistically processing it, an analog amount according to the deviation amount can be obtained. For example, when the comparison circuits CMP4 and CMP5 perform feedback control so that the number of times of outputting "0" and the number of times of outputting "1" become equal, it is controlled so that an average value of "dVce/dt" or "dIce/dt" becomes almost equal to the target value.

In FIG. 10A, for example, a case is assumed that the current value adjustment circuit ITRMC controls the inclination (dVce/dt) of the collector-emitter voltage Vce on the basis of a detection result (the magnitude relation with respect to the target value) of the comparison circuit CMP5$p$ in FIG. 8. In this case, each time the collector-emitter voltage Vce rises, a detection result by the comparison circuit CMP5$p$ is stored in the memories MEM1 and MEM2. Concretely, when the detection result is over the target value, 1-bit information expressing it is stored in the memory MEM1. When the detection result is under the target value, 1-bit information expressing it is stored in the memory MEM2.

The memory control circuit MCTL reads the memories MEM1 and MEM2 each time the detection results are stored in the memories MEM1 and MEM2 predetermined number of times (for example, tens or hundreds of times), outputs number N1 of times of occurrence that the detection result is over the target value based on the memory MEM1 to the multiplier MUL1, and outputs number N2 of times of occurrence that the detection result is under the target value based on the memory MEM2 to the multiplier MUL2. The multiplier MUL1 multiplies "N1" with a weight coefficient W1, and the multiplier MUL2 multiplies "N2" with a weight coefficient W2. An adder ADD calculates the difference between "N1×W1" and "N2×W2".

The current value adjustment circuit ITRMC determines whether the current value is increased, decreased, or maintained on the basis of the differential value from the adder ADD (in other words, a sum value of detection results of a plurality of times by the comparison circuit CMP5$p$). The current value adjustment circuit ITRMC outputs the current value adjustment signal TRM expressing any of an increase instruction UP, a decrease instruction DN, and a hold instruction HLD of the current value to a predetermined register.

If the weight coefficient W1 and the weight coefficient W2 are equal, "dVce/dt" exceeds the target value with a probability of 50%. For example, when the target value is determined to an upper limit value which allows surge voltage and radiation noise, "dVce/dt" exceeds the upper limit value with a probability of 50%. Consequently, the weight coefficient W1 is set to a value larger than the weight coefficient W2. In this case, feedback control is performed so that a value obtained by multiplying the number N1 of times that the detection result is over the target value with "W1" and a value obtained by multiplying the number N2 of times that the detection result is under the target value with "W2" (<W1) are equal. As a result, as illustrated in FIG. 10C, the frequency that "dVce/dt" exceeds the target value (upper limit value) can be decreased as much as possible. Although the case of controlling "dVce/dt" has been assumed here, the above is similarly performed also in the case of controlling "dIce/dt".

FIG. 11A is a conceptual diagram expressing an operation method by the current value adjustment circuit of FIG. 10A, and FIG. 11B is a conceptual diagram expressing an operation method as a comparison example of FIG. 11A. As illustrated in FIG. 11B, in the case of using a method of adjusting a current value on the basis of a detection result of once by the comparison circuit (so-called a bang-bang-type method), even in a situation where the current value is to be maintained originally, the current value is increased/decreased steadily.

In this case, the inclination of voltage and the inclination of current vary steadily. Consequently, for example, the PWM duty also varies. When the inverter system of FIG. 1 is taken as an example, there are possibilities such that distortion occurs in the sine wave of each phase generated on the basis of the PWM signal and a noise component increases. There is also the possibility that it is difficult to satisfy both stability of the feedback loop and the tracking speed, and there is a case that convergence of control decreases.

On the other hand, in the case of using the method of FIG. 10A, as illustrated in FIG. 11A, three kinds of adjustments of increase, decrease, and in addition, hold of the current value can be performed according to an error between the detection results of a plurality of times and the target value. For example, in the case where the calculation result of the adder ADD of FIG. 10A is zero or within a predetermined range using zero as center (for example, within ±2), the current value can be maintained.

As a result, the problem of variations of the inclination as described in FIG. 11B can be solved.

The amount of increasing/decreasing the current value (for example, ΔI increase, (2×ΔI) increase, or the like) can be adjusted according to the value of the calculation result of the adder ADD. Concretely, when the value of the calculation result of the adder ADD is within a range [1] (for example, +3 to +6), ΔI increase can be performed. When the value is within a range [2] (for example, +7 to +10) following the range [1], (2×ΔI) increase can be performed. Further, since low-speed feedback control of storing detection results of a plurality of times and, after that, reflecting them is performed, a stable feedback loop can be configured easily, and convergence of the control can be improved.

Figure 12:
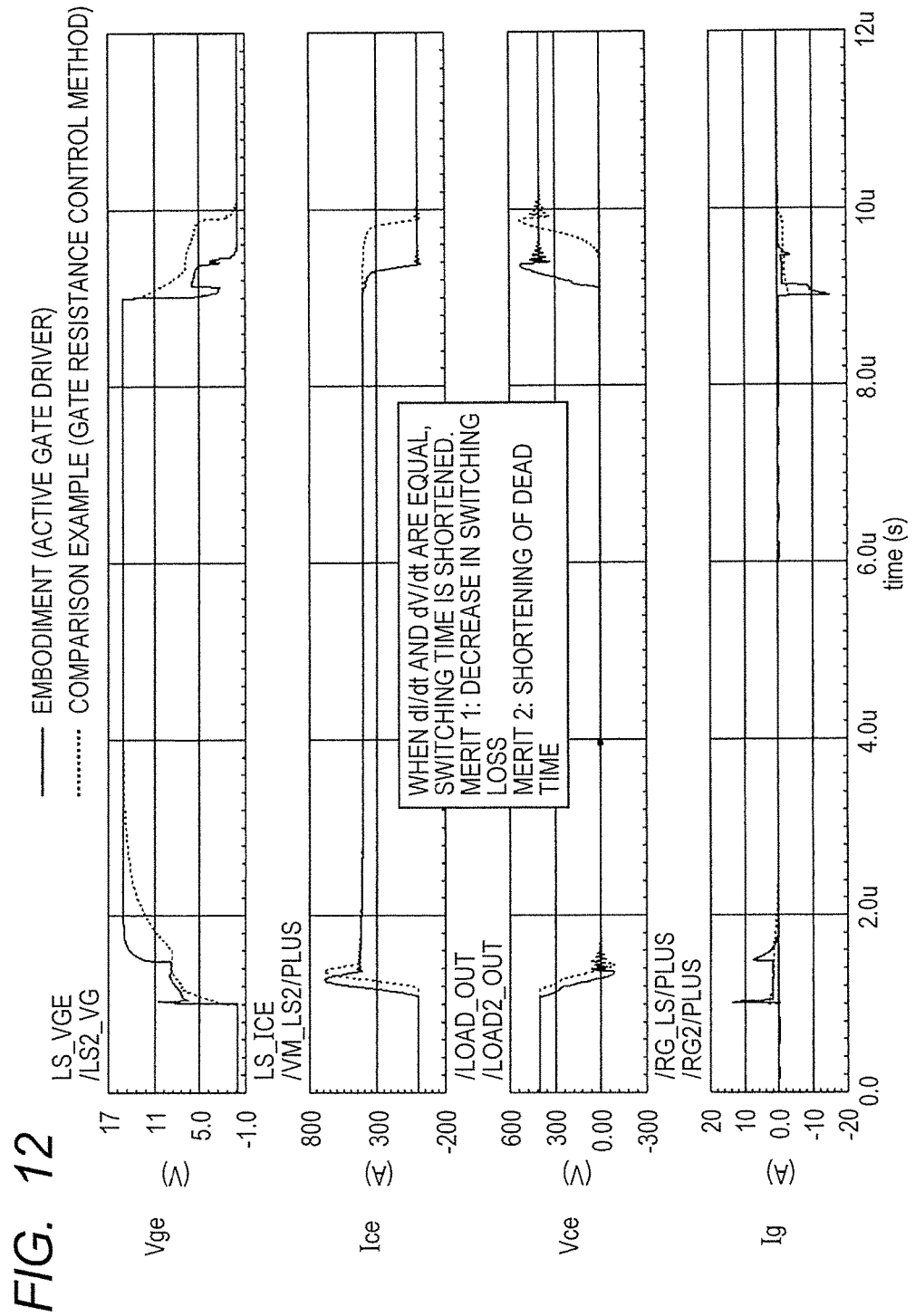
FIG. 12 is a waveform chart illustrating a simulation result in the case of driving a power transistor by using the gate driver of FIG. 3.

FIG. 12 is a waveform chart illustrating a simulation result in the case of driving a power transistor by using the gate driver of FIG. 3. In FIG. 12, as a comparison example, a waveform chart in the case of driving the power transistor TR by the gate resistance method of FIG. 20 is also illustrated by the dotted line. By using the method of the first embodiment, while maintaining the inclination (dIce/dt) of the collector-emitter current Ice and the inclination (dVce/dt) of the collector-emitter voltage Vce equivalent to those in the case of the gate resistance method, switching time can be largely shortened. Therefore, reduction in power loss in the power transistor TR, improvement in the power conversion efficiency, reduction of the radiation cost, and the like can be realized.

Representative Effects of First Embodiment

By using the drive device and the power supply system of the first embodiment as described above, the active gate driver which reduces a switching loss while maintaining the inclination of the voltage causing surge voltage, radiation noise, and the like and the inclination of the voltage causing an erroneous operation by recovery current, capacitance, coupling or the like to proper values can be realized. Further, by the active gate driver, the power transistor can be driven with lower power while reflecting the PVT variations as compared with the case of FIGS. 23A and 23B. By the reduction in power, the active gate driver can be easily applied to a system used in high-temperature environment.

In concrete description, in the open-loop-type configuration as illustrated in FIG. 23A, as the digital control can be performed, the consumption power can be reduced but it is difficult to reflect the PVT variations. On the contrary, in the configuration of the analog feedback type as illustrated in FIG. 23B, although the PVT variations can be reflected, since the analog circuits are main, it is difficult to lower the power consumption. In the first embodiment, therefore, as illustrated in FIG. 3 and the like, a high-speed open loop system of digital control of switching current using, as a trigger, the timing when the voltage between terminals or current between terminals of the power transistor TR reaches the reference value is provided. Consequently, different from the configuration of FIG. 23A, the current can be switched at high speed at a timing in which the PVT variations are reflected.

Further, in the first embodiment, as illustrated in FIG. 3 and the like, a low-speed feedback system of digital control of adjusting the current value while reflecting the inclination of the voltage between terminals or the current between terminals is provided. Consequently, different from the case of FIG. 23A, the power transistor TR can be driven with the current value in which the PVT variations are reflected. Further, by using the digital control also to the feedback system in addition to the open loop system, different from the case of FIG. 23B, the power consumption can be reduced. With respect to the feedback system, since the digital control is applied, not an analog amplifier but a comparison circuit can be used. By performing the feedback control on the basis of detection results of a plurality of times by the comparison circuit, linear control as performed by an analog amplifier can be performed.

Although the inclination detection circuit SDET is desirably comprised of a comparison circuit from the viewpoints of power consumption, circuit area, and the like as described above, the invention is not limited to the configuration. For example, in some cases, it is also possible to use a configuration of an analog circuit such as an analog amplifier, an analog digital converter, or the like and to feed back a digital output at low speed. Specifically, in the method of the first embodiment, different from the method of FIG. 23B, the open loop control is also used. Therefore, a high-speed feedback circuit including a high-speed amplifier is unnecessary, and a low-speed feedback circuit can be used. Thus, power consumption can be suppressed to some extent.

Second Embodiment

Details of Main Part of Power Supply System (Application Example [1])

Figure 13:
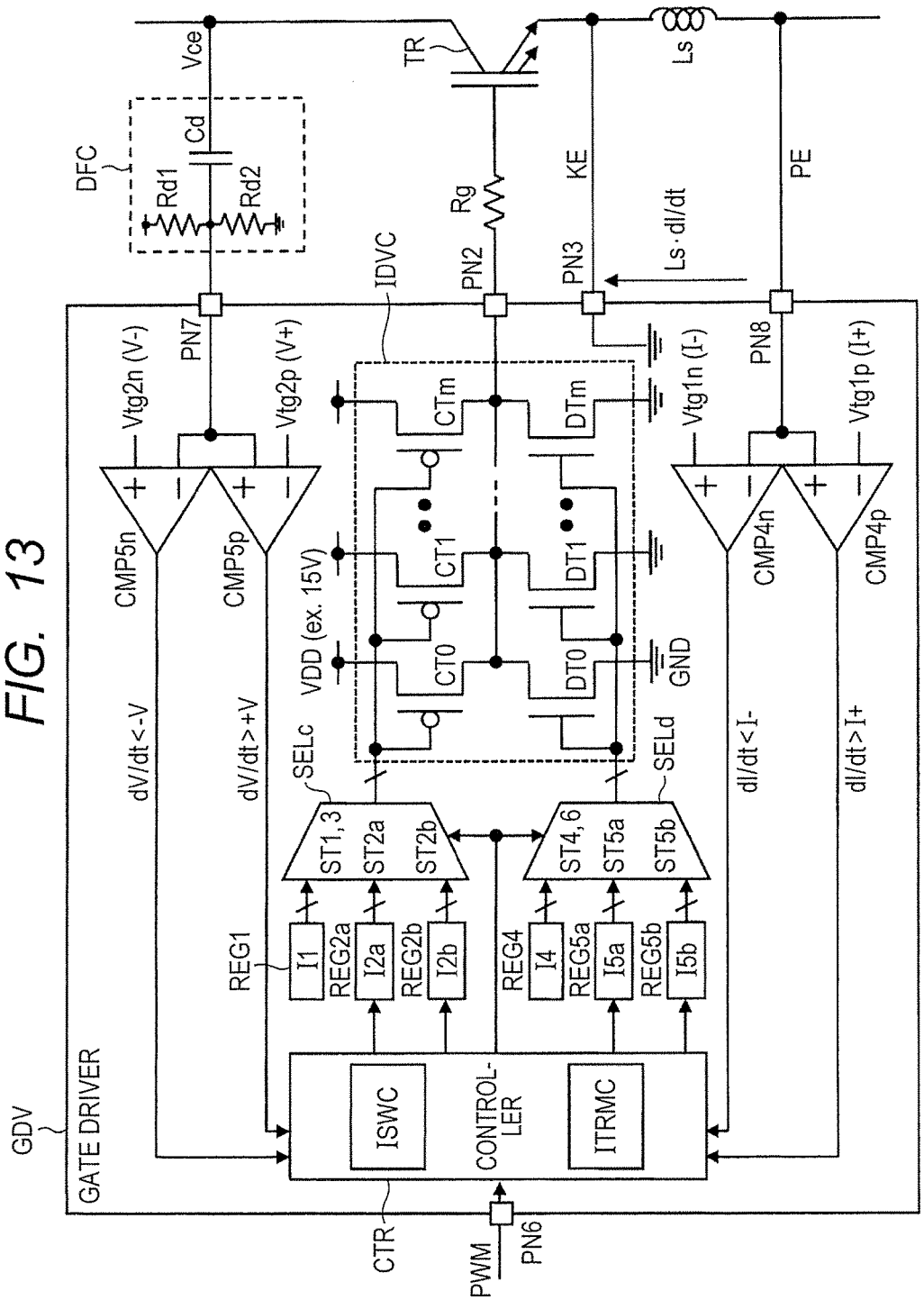
FIG. 13 is a circuit block diagram illustrating a configuration example of a main part in which attention is paid to trigger detection in a power supply system according to a second embodiment of the present invention.

FIG. 13 is a circuit block diagram illustrating a configuration example of a main part in which attention is paid to trigger detection in a power supply system according to a second embodiment of the present invention. The power supply system illustrated in FIG. 13 is different from the configuration example of FIG. 8 with respect to the point that comparison circuits CMP4$n$ and CMP5$n$ are added and the point that the register REG2 is changed to registers REG2$a$ and REG2$b$ and the register REG5 is changed to registers REG5$a$ and REG5$b$.

The comparison circuit CMP5$n$ is coupled together with the comparison circuit CMP5$n$ to the external terminal PN7 and detects the magnitude relation between the inclination (dVce/dt) of the collector-emitter voltage Vce as an output voltage of the differentiation circuit DFC and a target voltage Vtg2$n$(V−) of a preliminarily determined fall slope. Similarly, the comparison circuit CMP4$n$ is coupled to the external terminal PN8 together with the above-described comparison circuit CMP4$p$, and detects the magnitude relation between a voltage (Ls×(dIce/dt)) generated in the power emitter PE and a target value Vtg1$n$(I−) of a fall slope preliminarily determined.

Figure 14A:
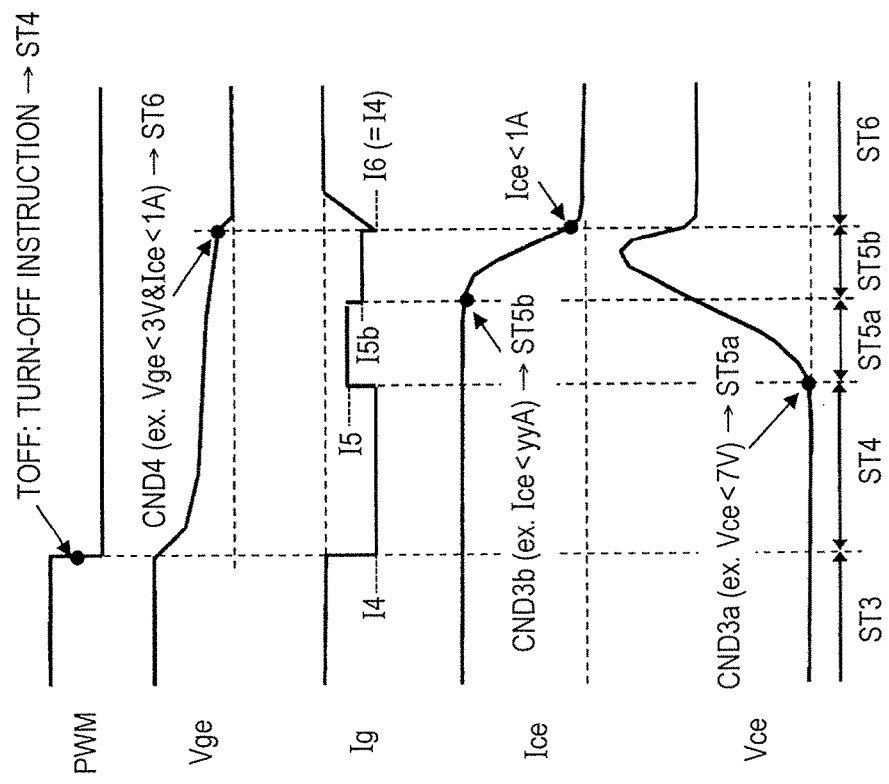
FIG. 14A is a diagram illustrating an example of detailed drive waveforms at the time of turn-on of the power transistor in FIG. 13.
Figure 14B:
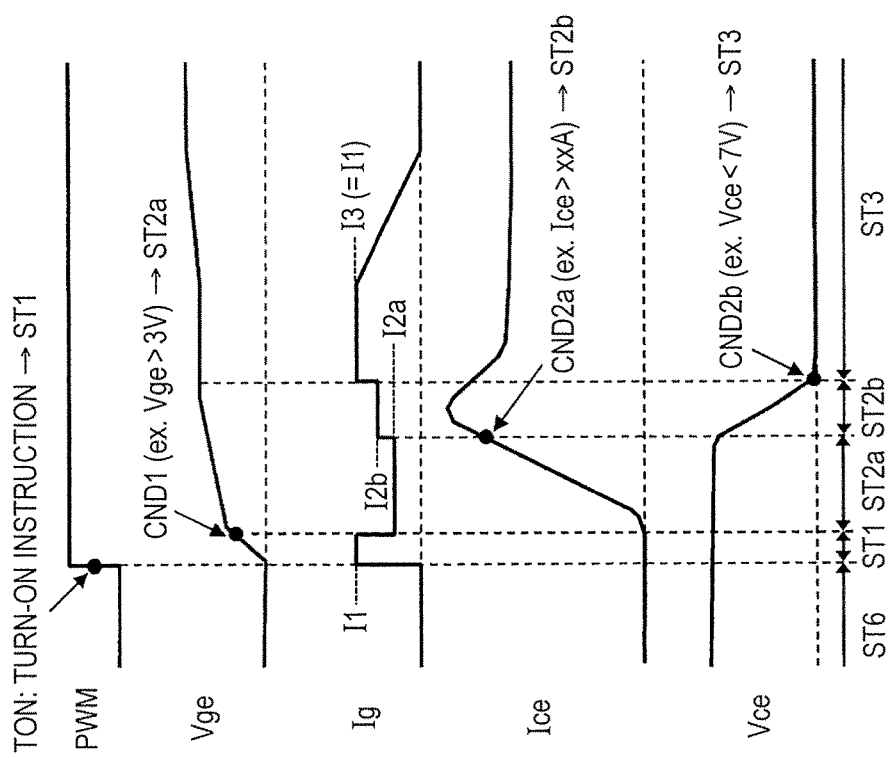
FIG. 14B is a diagram illustrating an example of detailed drive waveforms at the time of turn-off of the power transistor in FIG. 13.

FIG. 14A is a diagram illustrating an example of detailed drive waveforms at the time of turn-on of the power transistor in FIG. 13, and FIG. 14B is a diagram illustrating an example of detailed drive waveforms at the time of turn-off of the power transistor in FIG. 13. In FIG. 14A, as compared with the case of FIG. 5A, the state 2 (ST2) is divided into a state 2A (ST2$a$) and a state 2B (ST2$b$).

In a manner similar to the case of FIG. 5A, the current switching circuit ISWC shifts from the state 1 (ST1) to the state 2A (ST2$a$) in accordance with a trigger condition CND1 and executes a process of switching the register to be selected from the register REG1 to the register REG2 as the process of the state 2A (ST2$a$). In response to it, the variable current driver circuit IDVC charges the gate of the power transistor TR with the gate current Ig of a current value I2$a$ (|I2$a$|<|I1|) and controls the inclination at the time of rise of the collector-emitter current Ice of the power transistor TR.

Subsequently, the trigger detection circuit TDET (not illustrated in FIG. 13) detects that the collector-emitter current Ice rises to a predetermined reference value (for example, the value just before completion of the rise). Alternatively, the trigger detection circuit TDET detects that the collector-emitter voltage Vce falls to a predetermined reference value (for example, the value immediately after start of fall). The current switching circuit ISWC shifts to the state 2B (ST2$b$) using the detection result as the trigger condition CND2$a$ and executes, as the process of the state 2B (ST2$b$), the process of switching the register to be selected from the register REG2$a$ to the register REG2$b$. In response to it, the variable current driver circuit IDVC charges the gate of the power transistor TR with the gate current Ig of a current value I2$b$ (|I1|>|I2$b$|>|I2$a$|) and controls the inclination at the time of fall of the collector-emitter voltage Vce of the power transistor TR.

After that, in a manner similar to the case of the trigger condition CND2 of FIG. 5A, the trigger detection circuit TDET (concretely, the comparison circuit CMP3) detects that the collector-emitter voltage Vce falls to the reference value Vrf3 (for example, 7V). The current switching circuit ISWC executes a process of switching the register to be selected from the register REG2b to the register REG3 as a process of the state 3 (ST3).

On the other hand, also in FIG. 14B, as compared with the case of FIG. 5B, the state 5 (ST5) is divided into a state 5A (ST5a) and a state 5B (ST5b). In a manner similar to the case of the trigger condition CND3 of FIG. 5B, the trigger detection circuit TDET (concretely, the comparison circuit CMP3) detects that the collector-emitter voltage Vce rises to a reference value Vref3 (for example, 7V). The current switching circuit ISWC shifts to the state 5A (ST5a) using the detection result as a trigger condition CND3a and executes a process of switching the register to be selected from the register REG4 to the register REG5a as the process of the state 5A (ST5a). In response to it, the variable current driver circuit IDVC discharges the gate of the power transistor TR with the gate current Ig of a current value I5a (|I5a|<|I4|) and controls the inclination at the time of rise of the collector-emitter voltage Vce of the power transistor TR.

Subsequently, the trigger detection circuit TDET (not illustrated in FIG. 13) detects that the collector-emitter current Ice falls to a predetermined reference value (for example, the value just after start of fall). Alternatively, the trigger detection circuit TDET detects that the collector-emitter voltage Vce rises to a predetermined reference value (for example, the value just before completion of the rise). The current switching circuit ISWC shifts to the state 5B (ST5b) using the detection result as the trigger condition CND3b and executes, as the process of the state 5B (ST5b), the process of switching the register to be selected from the register REG5a to the register REG5b.

In response to it, the variable current driver circuit IDVC discharges the gate of the power transistor TR with the gate current Ig of a current value I5b (for example, |I4|>|I5b|>|I5a|) and controls the inclination at the time of fall of the collector-emitter current Ice of the power transistor TR. After that, in a manner similar to the case of FIG. 5B, the current switching circuit ISWC switches the register to be selected from the register REG5b to the register REG6 as a process of the state 6 (ST6).

The current value adjustment circuit ITRMC in FIG. 13 adjusts the current value I2a of the register REG2a on the basis of the detection result of the comparison circuit CMP4p in the state 2A (ST2a) and adjusts the current value I2b of the register REG2b on the basis of the detection result of the comparison circuit CMP5n in the state 2B (ST2b). The current value adjustment circuit ITRMC adjusts the current value I5a of the register REG5a on the basis of the detection result of the comparison circuit CMP5p in the state 5A (ST5a) and adjusts the current value I5b of the register REG5b on the basis of the detection result of the comparison circuit CMP4n in the state 5B (ST5b).

Representative Effect of Second Embodiment

By using the above-described drive device and the power supply system of the second embodiment, in some cases, in addition to the various effects described in the first embodiment, the inclinations at the time of rise/fall of the voltage and current can be controlled independently, and the switching characteristics can be further improved. Concretely, in FIG. 5A, the inclination of the rise of the collector-emitter current Ice is controlled by the current value I2, and the inclination of the fall of the collect-remitter voltage Vce is controlled by the same current value I2. Similarly, in FIG. 5B, the inclination of the rise of the collector-emitter voltage Vce is controlled by the current value I5, and the inclination of the fall of the collector-emitter current Ice is controlled by the same current value I5.

On the other hand, there is the case that it is desired to positively control the inclination of the fall of the collector-emitter voltage Vce and the collector-emitter current Ice. Consequently, for example, the magnitude of not only overshoot but also undershoot can be controlled. When undershoot is not a big program, by shortening the fall time of voltage and that of current (that is, periods ST2b and ST5b in FIGS. 14A and 14B) as much as possible, the switching loss can be further reduced.

To obtain such an effect, it is beneficially to use the configuration capable of controlling the inclinations of rise/fall of voltage and current independently as in the second embodiment. However, when the number of states increases, the number of comparison circuits increases accordingly, and it may cause increase in the circuit area, complication of the operation, and the like. From the viewpoint, it is beneficial to use, for example, three states in each switching period like in the first embodiment.

Third Embodiment

Details of Main Part of Power Supply System (Application Example 2)

Figure 15:
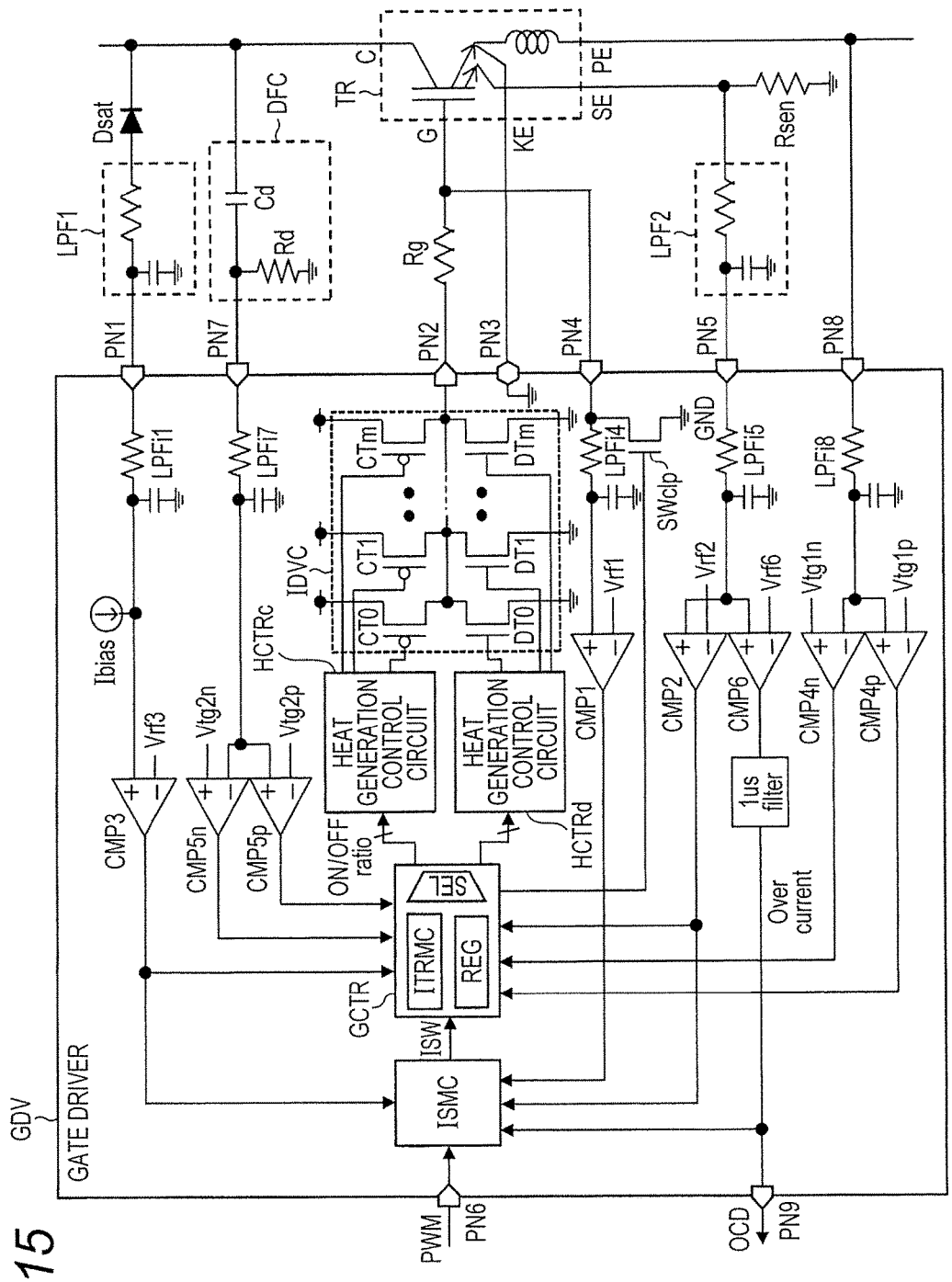
FIG. 15 is a circuit block diagram illustrating a configuration example of a main part in a power supply system according to a third embodiment of the present invention.

FIG. 15 is a circuit block diagram illustrating a configuration example of a main part in a power supply system according to a third embodiment of the present invention. FIG. 15 illustrates a configuration example of combination of the configuration example of FIG. 7 and the configuration example of FIG. 13. In addition, the gate driver GDV in FIG. 15 has an external terminal PN9, low-pass filters LPFi1, LPFi4, LPFi5, LPFi7, and LPFi8, a comparison circuit CMP6, an active mirror clamp switch SWclp, and heat generation control circuits HCTRc and HCTRd.

The low-pass filters LPFi1, LPFi4, LPFi5, LPFi7, and LPFi8 are coupled to the external terminals PN1, PN4, PN5, PN7, and PN8, respectively and remove noise at inputs of the comparison circuits. The comparison circuit CMP6 is coupled to the external terminal PN5 via the low-pass filter LPFi5 and compares the voltage according to the collector-emitter current Ice detected at the external terminal PN5 with a reference value (for example, 0.5V), thereby detecting overcurrent. When the overcurrent is detected continuously for a predetermined period, an overcurrent detection signal OCD is output to the external terminal PN9. On reception of the overcurrent detection signal OCD, the current switching circuit ISWC performs a predetermined protection operation of, for example, forcibly turning off the power transistor TR.

In this case, the above-described current value adjustment circuit ITRMC, the registers REG, and the selection circuit SEL are mounted on a gate control circuit GCTR. The active mirror clamp switch SWclp is coupled between the external terminal PN4 and the ground power supply voltage GND. The gate control circuit GCTR controls to turn off the power transistor TR on the basis of the current switching signal ISW from the current switching circuit ISWC and, on completion of the turn-off, turn on the active mirror clamp switch SWclp. Consequently, the gate of the power transistor TR is coupled to the ground power supply voltage GND not through the gate resistor Rg, so that erroneous firing or the like of the power transistor TR is prevented more certainly.

The heat generation control circuit HCTRc receives the number of on times of the charge transistors CT0 to CTm from the gate control circuit GCTR and controls on/off of each of the charge transistors CT0 to CTm. Similarly, the heat generation control circuit HCTRd receives the number of on times of the discharge transistors DT0 to DTm from the gate control circuit GCTR and controls on/off of each of the discharge transistors DT0 to DTm.

Operation of Heat Generation Control Circuit

Figure 16:
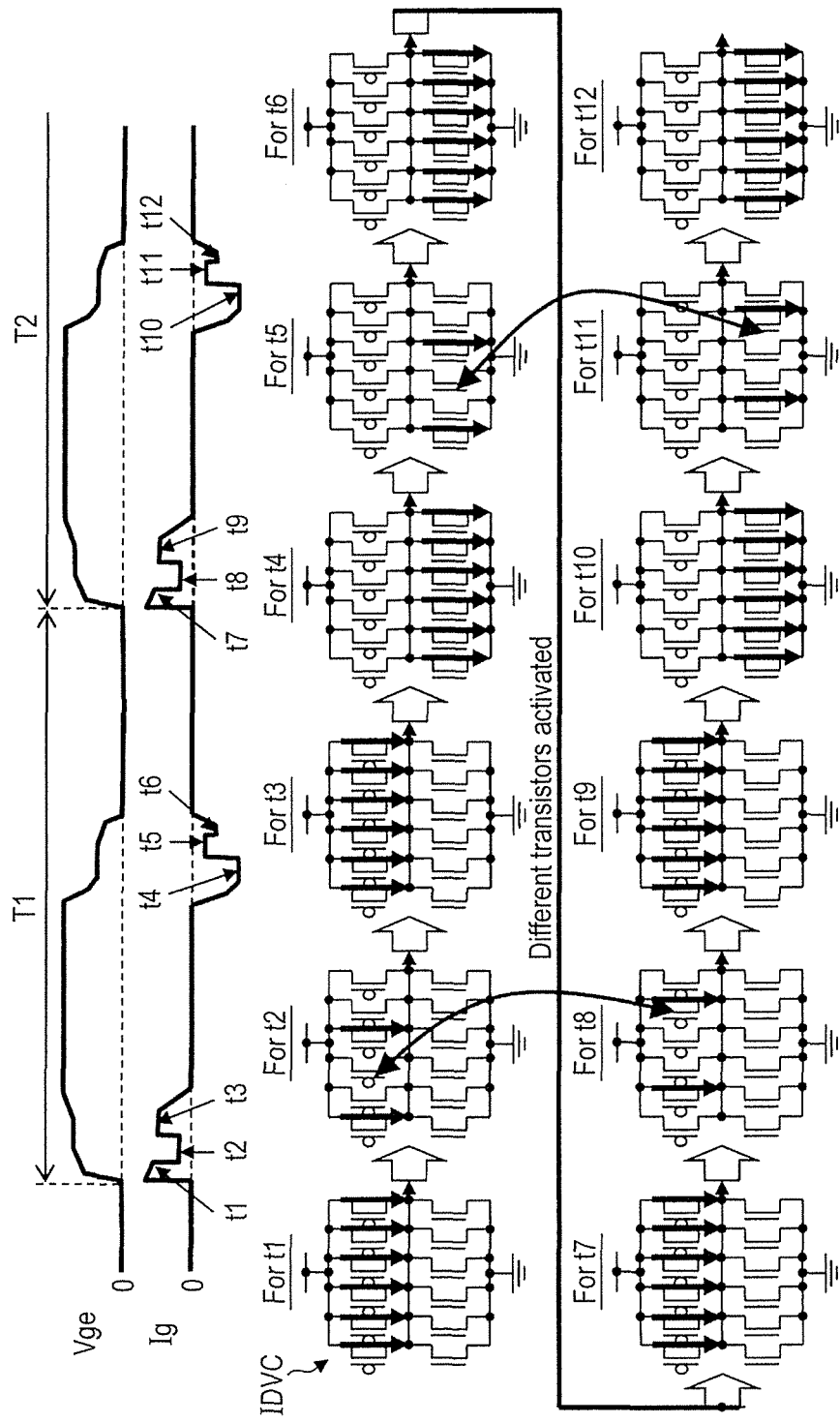
FIG. 16 is an explanatory diagram illustrating a schematic operation example of a heat generation control circuit in FIG. 15.

FIG. 16 is an explanatory diagram illustrating a schematic operation example of a heat generation control circuit in FIG. 15. In FIGS. 15 and 16, for example, the plurality (m+1 pieces) of the charge transistors CT0 to CTm in the variable current driver circuit IDVC are configured by the same transistor size, and the plurality (m+1 pieces) of the discharge transistors DT0 to DTm are also configured by the same transistor size. Each time the plurality of charge transistors CT0 to CTm are controlled to be on, the heat generation control circuit HCTRc changes the position of the charge transistors to be on. Each time the plurality of discharge transistors DT0 to DTm are controlled to be on, the heat generation control circuit HCTRd changes the position of the charge transistors to be on.

At timing t1 (state 1 (ST1) in FIG. 5A) in a PWM cycle T1 in FIG. 16, all of the plurality of charge transistors CT0 to CTm are controlled to be on so that the gate current (source current) Ig of 4A or the like flows. ON the other hand, at timing t2 subsequent to the timing t1 (state 2 (ST2) in FIG. 5A), by controlling 25% of the plurality of charge transistors CT0 to CTm to be on, the gate current Ig is controlled to 1 A or the like.

If the transistors in the same positions as those in the case of the timing t2 are controlled to be on also at timing t8 in the following PWM cycle T2 (state 2 (ST2)), heat generation is concentrated in a part of the variable current driver circuit IDVC, and it leads to fluctuations in the characteristics, shortening of the life, and the like. Consequently, at the timing t8, the heat generation control circuit HCTRc controls the charge transistors CT in positions different from those in the case of the timing t2 to be on. Similarly, the heat generation control circuit HCTRd controls the discharge transistors DT in positions which are different between timing t5 in the PWM cycle T1 (state 5 (ST5) in FIG. 5B) and timing t11 (state 5 (ST5) in the PWM cycle T2 to be on. By the control, generation of heat is dispersed, reduction in the characteristic fluctuations due to temperature rise, increase in the life (improvement in reliability), and the like can be realized.

Figure 17A:
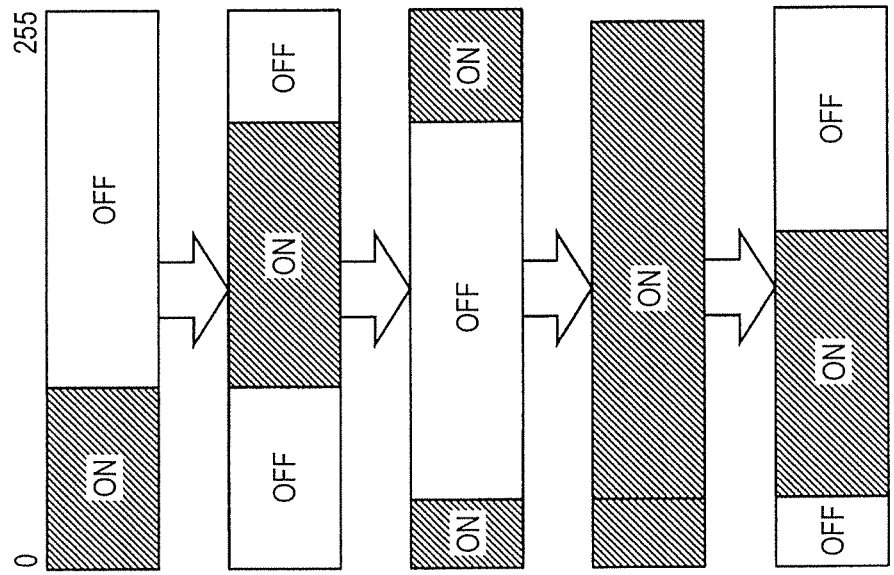
FIG. 17A is a flowchart illustrating an example of detailed processes of the heat generation control circuit in FIG. 15.
Figure 17B:
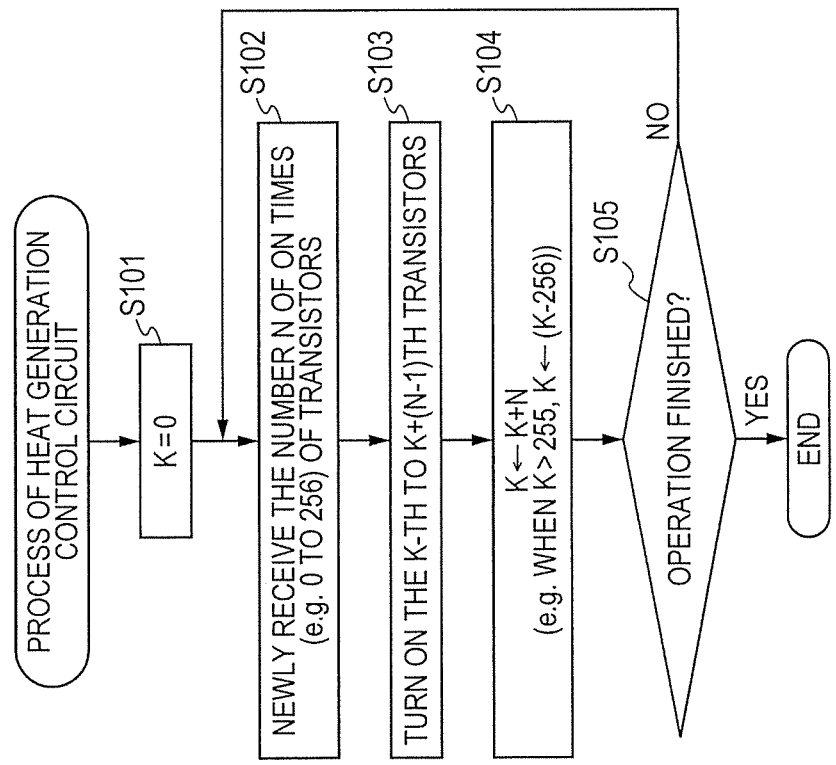
FIG. 17B is a supplemental diagram of FIG. 17A.

FIG. 17A is a flowchart illustrating an example of detailed processes of the heat generation control circuit in FIG. 15, and FIG. 17B is a supplemental diagram of FIG. 17A. A case is assumed that the variable current driver circuit IDVC has 256 charge transistors CT0 to CT255 and 256 discharge transistors DT0 to DT255. In FIG. 17A, the heat generation control circuit HCTRc (also the heat generation control circuit HCTRd) determines K to 0 (step S101) and waits to newly receive the number N of transistors which are on (for example, N is an integer of 0 to 256) from the gate control circuit GCTR (step S102).

When the number N of transistors which are on is newly received, the heat generation control circuit HCTRc (HCTRd) controls the Kth to (K+(N−1)th charge transistors CT (discharge transistors DT) to be on (step S103). Subsequently, the heat generation control circuit HCTRc (HCTRd) updates K with (K+N) (step S104). As a result, in the case where K>255, the heat generation control circuit HCTRc (HCTRd) returns to step S102 and continues the process (step S105) unless there is no operation finish instruction by an error, reset, or the like.

By using the processes as described above, as illustrated in FIG. 17B, each time a plurality of transistors (the charge transistors CT or the discharge transistors DT) are controlled to be on, the positions of the transistors which are controlled to be on are changed. Consequently, in each of the on cycles, generation of heat can be dispersed. In the example of FIG. 17B, however, transistors adjacent each other are controlled to be on. Therefore, heat generation is concentrated in a local area in the region of the 256 transistors in each on cycle.

FIG. 18 is a conceptual diagram illustrating a disposition configuration example of transistors in the variable current driver circuit in FIG. 15. As illustrated in FIG. 18, 0th to m-th transistors (charge transistors CT or discharge transistors DT) are disposed so that transistors in successive numbers are not adjacent. Consequently, when the process of step S103 in FIG. 17A is performed, as illustrated in FIG. 18, the positions of transistors controlled to be on are widely dispersed in the transistor region, and concentration of local heat generation can be suppressed. As a result, the characteristic fluctuations due to temperature rise can be further reduced.

Representative Effects of Third Embodiment

By using the drive device and the power supply system of the third embodiment as described above, in addition to the various effects described in the first and second embodiments, reduction of the characteristic fluctuations, increase in life (improvement of reliability), and the like in the variable current driver circuit IDVC can be further realized. The heat generation dissipating method is not always limited to the methods of FIGS. 17A and 18A but can be realized by various other methods. For example, transistors controlled to be on may be determined by a random method using a pseudorandom number generation circuit or the like each time the transistors are controlled to be on. In this case, however, there is the possibility that heat generation is concentrated in the short term. Therefore, from this viewpoint, it is desirable to use a regular method as described in FIGS. 17A and 18.

Although the invention achieved by the inventors of the present invention has been concretely described on the basis of the embodiments, the present invention is not limited to the foregoing embodiments but can be variously changed without departing the gist. For example, the foregoing embodiments have been described in detail to explain the present invention so as to be understood easily, and the invention is not always limited to the entire configuration described. A part of the configuration of any of the embodiments can be replaced with the configuration of another embodiment, or the configuration of any of the embodiments can be added to the configuration of another embodiment. With respect to a part of the configuration of each of the embodiments, another configuration can be added, deleted, or replaced.

Additional Note (1) A drive device of the embodiment has a plurality of registers, a variable current driver circuit, a first detection circuit, a current switching circuit, a second detection circuit, and a current value adjustment circuit. Each of the plurality of registers holds a current value as a digital value. The variable current driver circuit receives the digital value of any of the plurality of registers and drives a power transistor by drive current based on the digital value. The first detection circuit monitors a voltage between terminals or a current between terminals in a switching period of the power transistor and detects that the voltage between terminals or the current between terminals reaches a predetermined reference value. The current switching circuit selects a register outputting a current value to the variable current driver circuit from the plurality of registers and switches the register to be selected using a detection result of the first detection circuit as a trigger in the switching period, thereby making the drive current of the variable current driver circuit shift. The second detection circuit detects an inclination of the voltage between terminals or the current between terminals of the power transistor in the switching period. The current value adjustment circuit feedback-controlling a current value of a predetermined register in the plurality of registers so that the detection result of the second detection circuit becomes close to a preliminarily determined target value.

(2) The current switching circuit executes first, second, and third processes. In the first process, the current switching circuit selects a first register included in the plurality of registers using a turn-on instruction of the power transistor from the outside as a trigger. In the second process, the current switching circuit switches the register to be selected from the first register to a second register using a detection result of the second voltage between terminals (gate-emitter voltage or gate-source voltage) or the first current between terminals (collector-emitter current or drain-source current) by the first detection circuit as a trigger. In the third process, the current switching circuit switches the register to be selected from the second register to a third register using a detection result of the first voltage between terminals (collector-emitter voltage or drain-source voltage) by the first detection circuit as a trigger.

(3) The current switching circuit executes a process of 2A and a process of 2B in the second process. In the process of 2A, the current switching circuit switches the register to be selected from the first register to a register of 2A using a detection result of the second voltage between terminals or the first current between terminals by the first detection circuit as a trigger. In the process of 2B, the current switching circuit switches the register to be selected from the register of 2A to a register of 2B using a detection result of the first current between terminals or the first voltage between terminals by the first detection circuit as a trigger.

(4) The third register is commonly used as the first register.

(5) The current switching circuit executes fourth, fifth, and sixth processes. In the fourth process, the current switching circuit selects a fourth register included in the plurality of registers using a turn-off instruction of the power transistor from the outside as a trigger. In the fifth process, the current switching circuit switches the register to be selected from the fourth register to a fifth register using a detection result of the first voltage between terminals by the first detection circuit as a trigger. In the sixth process, the current switching circuit switches the register to be selected from the fifth register to a sixth register using a detection result of the second voltage between terminals or the first current between terminals by the first detection circuit as a trigger.

(6) The current switching circuit executes a process of 5A and a process of 5B in the fifth process. In the process of 5A, the current switching circuit switches the register to be selected from the fourth register to a register of 5A using a detection result of the first voltage between terminals by the first detection circuit as a trigger. In the process of 5B, the current switching circuit switches the register to be selected from the register of 5A to a register of 5B using a detection result of the first current between terminals or the first voltage between terminals by the first detection circuit as a trigger.

(7) The sixth register is commonly used as the fourth register.

(8) The second detection circuit is a comparison circuit detecting a magnitude relation between an inclination of the voltage between terminals or the current between terminals and a preliminarily determined target value, and the current value adjustment circuit determines whether a current value of the predetermined register is increased, decreased, or maintained on the basis of a sum value of detection results of a plurality of times by the comparison circuit.

(9) The current value adjustment circuit determines a current value of a predetermined register on the basis of a differential value of results obtained by weighting the number of times the inclination is larger than a target value and the number of times the inclination is smaller than the target value derived from detection results of a plurality of times by the comparison circuit.

(10) The variable current driver circuit has a plurality of charge transistors provided in parallel between a power supply voltage and a gate of the power transistor and configured by the same transistor size and a plurality of discharge transistors provided in parallel between a ground power supply voltage and a gate of the power transistor and configured by the same transistor size. The drive device has a heat generation control circuit which changes positions of charge transistors controlled to be on each time the plurality of charge transistors are controlled to be on, and changes positions of discharge transistors controlled to be on each time the plurality of discharge transistors are controlled to be on.

(11) The plurality of charge transistors or the plurality of discharge transistors are comprised of 0th to Mth transistors. Each time N pieces transistors (N is an integer from 0 to (M+1)) are controlled to be on in the 0th to Mth transistors, the heat generation circuit executes a process of controlling the K-th to K+(N−1) transistors to be on and a process of updating the value of K with the value of (K+N).

(12) The 0th to Mth transistors are disposed so that transistors of successive numbers are not adjacent.

What is claimed is:

1. A drive device driving a power transistor, comprising:
   a plurality of registers each holding a current value as a digital value;
   a variable current driver circuit to which the digital value of any of the plurality of registers is input and which drives the power transistor by drive current based on the digital value;
   a first detection circuit monitoring a voltage between terminals or a current between terminals of the power transistor in a switching period of the power transistor and detecting that the voltage between terminals or the current between terminals reaches a predetermined reference value; and
   a current switching circuit selecting a register outputting a current value to the variable current driver circuit from the plurality of registers and switching the register to be selected using a detection result of the first detection circuit as a trigger in the switching period, thereby making the drive current of the variable current driver circuit shift, and
   wherein the first detection circuit detects at least one of a first voltage between terminals as a collector-emitter voltage or a drain-source voltage, a first current between terminals as a collector-emitter current or a drain-source current, and a second voltage between terminals as a gate-emitter voltage or a gate-source voltage in the power transistor.

2. The drive device according to claim 1,
   wherein the current switching circuit executes:

a first process of selecting a first register included in the plurality of registers using a turn-on instruction of the power transistor from the outside as a trigger; and
a second process of switching the register to be selected from the first register to a second register included in the plurality of registers using a detection result of the second voltage between terminals or the first current between terminals by the first detection circuit as a trigger, and
wherein an absolute value of a current value held in the second register is smaller than that of a current value held in the first register.

3. The drive device according to claim 2,
wherein the current switching circuit executes:
a third process of switching the register to be selected from the second register to a third register included in the plurality of registers using a detection result of the first voltage between terminals by the first detection circuit as a trigger, and
wherein the absolute value of a current value held in the third register is larger than that of a current value held in the second register.

4. The drive device according to claim 1,
wherein the current switching circuit executes:
a fourth process of selecting a fourth register included in the plurality of registers using a turn-off instruction of the power transistor from the outside as a trigger; and
a fifth process of switching the register to be selected from the fourth register to a fifth register included in the plurality of registers using a detection result of the first voltage between terminals by the first detection circuit as a trigger, and
wherein an absolute value of a current value held in the fifth register is smaller than that of a current value held in the fourth register.

5. The drive device according to claim 4,
wherein the current switching circuit executes:
a sixth process of switching the register to be selected from the fifth register to a sixth register included in the plurality of registers using a detection result of the second voltage between terminals or the first current between terminals by the first detection circuit as a trigger, and
wherein the absolute value of a current value held in the sixth register is larger than that of a current value held in the fifth register.

6. A drive device driving a power transistor, comprising:
a plurality of registers each holding a current value as a digital value;
a variable current driver circuit to which the digital value of any of the plurality of registers is input and which drives the power transistor by drive current based on the digital value;
a first detection circuit monitoring a voltage between terminals or a current between terminals of the power transistor in a switching period of the power transistor and detecting that the voltage between terminals or the current between terminals reaches a predetermined reference value in a switching period of the power transistor;
a current switching circuit selecting a register outputting a current value to the variable current driver circuit from the plurality of registers and switching the register to be selected using a detection result of the first detection circuit as a trigger in the switching period, thereby making the drive current of the variable current driver circuit shift;
a second detection circuit detecting an inclination of the voltage between terminals or the current between terminals in the switching period; and
a current value adjustment circuit feedback-controlling a current value of a predetermined register in the plurality of registers so that the detection result of the second detection circuit becomes close to a preliminarily determined target value.

7. The drive device according to claim 6, a loop bandwidth of feedback control by the current value adjustment circuit is equal to or less than ⅓ of switching frequency of the power transistor.

8. The drive device according to claim 6,
wherein the second detection circuit is a comparison circuit detecting a magnitude relation between the inclination of the voltage between terminals or the current between terminals and a preliminarily determined target value, and
wherein the current value adjustment circuit determines whether a current value of the predetermined register is increased, decreased, or maintained on the basis of a sum value of detection results of a plurality of times by the comparison circuit.

9. The drive device according to claim 6, wherein the second detection circuit detects at least one of a first inclination as an inclination of a collector-emitter voltage or a drain-source voltage of the power transistor and a second inclination as an inclination of a collector-emitter current or a drain-source current.

10. The drive device according to claim 9, wherein the first detection circuit detects at least one of a first voltage between terminals as a collector-emitter voltage or a drain-source voltage of the power transistor, a first current between terminals as a collector-emitter current or a drain-source current, and a second voltage between terminals as a gate-emitter voltage or a gate-source voltage.

11. The drive device according to claim 10,
wherein the current switching circuit executes:
a first process of selecting a first register included in the plurality of registers using a turn-on instruction of the power transistor from the outside as a trigger; and
a second process of switching the register to be selected from the first register to a second register included in the plurality of registers using a detection result of the second voltage between terminals or the first current between terminals by the first detection circuit as a trigger,
wherein the current value adjustment circuit feedback-controls a current value of the second register so that a detection result of the second inclination by the second detection circuit becomes close to a preliminarily determined target value, and
wherein a current value held in the first register is a preliminarily determined fixed value.

12. The drive device according to claim 10,
wherein the current switching circuit executes:
a fourth process of selecting a fourth register included in the plurality of registers using a turn-off instruction of the power transistor from the outside as a trigger; and
a fifth process of switching the register to be selected from the fourth register to a fifth register included in the plurality of registers using a detection result of the first voltage between terminals by the first detection circuit as a trigger,
wherein the current value adjustment circuit feedback-controls a current value of the fifth register so that a detection result of the first inclination by the second detection circuit becomes close to a preliminarily determined target value, and wherein a current value held in the fourth register is a preliminarily determined fixed value.

13. The drive device according to claim 6, wherein the variable current driver circuit comprises:
    a plurality of charge transistors provided in parallel between a power supply voltage and a gate of the power transistor; and
    a plurality of discharge transistors provided in parallel between a ground power supply voltage and a gate of the power transistor,
    wherein the number of the plurality of charge transistors which are turned on is controlled on the basis of the digital value, and
    wherein the number of the plurality of discharge transistors which are turned on is controlled on the basis of the digital value.

14. The drive device according to claim 13,
    wherein the plurality of charge transistors are configured by the same transistor size,
    wherein the plurality of discharge transistors are configured by the same transistor size, and
    wherein the drive device has a heat generation control circuit which changes positions of charge transistors controlled to be on each time the plurality of charge transistors are controlled to be on, and changes positions of discharge transistors controlled to be on each time the plurality of discharge transistors are controlled to be on.

15. A power supply system comprising:
    a power transistor supplying power to a predetermined load; and
    a drive device driving the power transistor on the basis of a PWM signal,
    wherein the drive device comprises:
    a plurality of registers each holding a current value as a digital value;
    a variable current driver circuit to which the digital value of any of the plurality of registers is input and which drives the power transistor by drive current based on the digital value;
    a first detection circuit monitoring a voltage between terminals or a current between terminals of the power transistor in a switching period of the power transistor and detecting that the voltage between terminals or the current between terminals reaches a predetermined reference value; and
    a current switching circuit selecting a register outputting a current value to the variable current driver circuit from the plurality of registers and switching the register to be selected using a detection result of the first detection circuit as a trigger in the switching period, thereby making the drive current of the variable current driver circuit shift.

16. The power supply system according to claim 15, wherein the drive device comprises:
    a second detection circuit detecting an inclination of the voltage between terminals or the current between terminals in the switching period; and
    a current value adjustment circuit feedback-controlling a current value of a predetermined register in the plurality of registers so that the detection result of the second detection circuit becomes close to a preliminarily determined target value.

17. The power supply system according to claim 16, wherein the power supply system has a resistive element inserted in series between the drive device and a gate of the power transistor.

18. The power supply system according to claim 16, further comprising a differentiation circuit including a capacitor inserted in series between the drive device and a collector or a drain of the power transistor,
    wherein the second detection circuit detects an output voltage of the differentiation circuit, thereby detecting an inclination of a collector-emitter voltage or a drain-source voltage of the power transistor.

19. The power supply system according to claim 16, wherein the power transistor comprises:
    a Kelvin terminal as an emitter terminal or a source terminal for supplying ground power supply voltage to the drive device; and
    a power terminal as an emitter terminal or a source terminal for supplying power to the predetermined load and having a parasitic inductance component larger than that of the Kelvin terminal, and
    wherein the second detection circuit detects a potential difference between the Kelvin terminal and the power terminal, thereby detecting an inclination of a collector-emitter current or a drain-source current of the power transistor.

* * * * *